(12) United States Patent
Nakamura et al.

(10) Patent No.: US 6,303,478 B1
(45) Date of Patent: Oct. 16, 2001

(54) SEMICONDUCTOR INTEGRATED CIRCUIT DEVICE AND METHOD FOR FABRICATING THE SAME

(75) Inventors: Yoshitaka Nakamura, Oume; Nobuyoshi Kobayashi, Kawagoe; Takuya Fukuda, Kodaira; Masayoshi Saito, Hachoiji, all of (JP)

(73) Assignee: Hiatchi, Ltd., Tokyo (JP)

( * ) Notice: Subject to any disclaimer, the term of this patent is extended or adjusted under 35 U.S.C. 154(b) by 0 days.

(21) Appl. No.: 09/421,125

(22) Filed: Oct. 19, 1999

Related U.S. Application Data

(62) Division of application No. 08/962,730, filed on Nov. 3, 1997, now Pat. No. 5,986,299.

(30) Foreign Application Priority Data

Nov. 5, 1996 (JP) .................................................. 8-292411

(51) Int. Cl.$^7$ .............................................. H01L 21/8242
(52) U.S. Cl. .......................... 438/570; 438/253; 438/244; 438/396; 438/399
(58) Field of Search ........................... 438/570, 243–253, 438/396–399

(56) References Cited

U.S. PATENT DOCUMENTS

| | | | |
|---|---|---|---|
| 5,365,095 | 11/1994 | Shono et al. | 257/296 |
| 5,578,847 | 11/1996 | Aoki et al. | 257/296 |
| 5,689,126 | 11/1997 | Takaishi | 257/306 |
| 5,717,251 * | 2/1998 | Hayashi et al. | 257/758 |
| 5,740,099 | 4/1998 | Tanigawa | 257/350 |
| 5,748,521 | 5/1998 | Lee | 257/296 |
| 6,130,449 * | 10/2000 | Matsuoka et al. | 257/296 |

FOREIGN PATENT DOCUMENTS

| | | |
|---|---|---|
| 6-085187 | 3/1994 | (JP) . |
| 6-120447 | 4/1994 | (JP) . |
| 409139475 * | 5/1997 | (JP) . |

* cited by examiner

*Primary Examiner*—Charles Bowers
*Assistant Examiner*—Thanh Nguyen
(74) *Attorney, Agent, or Firm*—Antonelli, Terry, Stout & Krasu, LLP

(57) ABSTRACT

A method of fabricating a semiconductor device having, for example, a memory cell array portion and a peripheral circuit portion is disclosed. By such a method, a first interlayer insulating film is formed on a semiconductor substrate, a first connection hole is formed by selectively removing a predetermined portion of the first interlayer insulating film, the sides of the first hole being substantially vertical to the bottom thereof, a first plug is formed by padding the first hole with a metallic film and, subsequently, a second interlayer insulating film is formed on the first insulating film, a second hole is formed by selectively removing a predetermined portion of the second interlayer insulating film, the sides of the second hole being substantially vertical to the bottom thereof, and a second plug aligned to be in direct connection with the first plug is formed by padding the second hole with the metallic film. A MOS transistor is formed on the semiconductor substrate before the first interlayer insulating film is formed and the first hole formed is extended to expose the diffused layer of the MOS transistor. The surfaces of both the first and second interlayer insulating films are smoothed by a chemical mechanical polishing (CMP) method. The process of padding the connection holes with the metallic film is effected through a CVD or selective CVD method.

20 Claims, 38 Drawing Sheets

SNCT: STORAGE NODE CONTACT
BLCT: BIT-LINE CONTACT

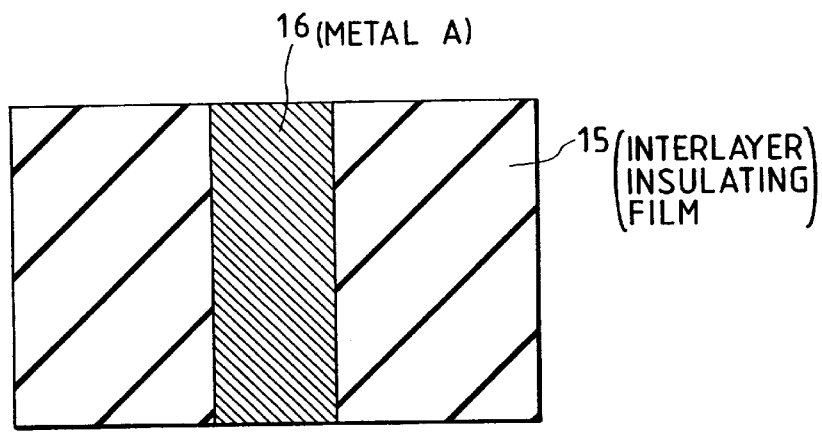
FIG. 43
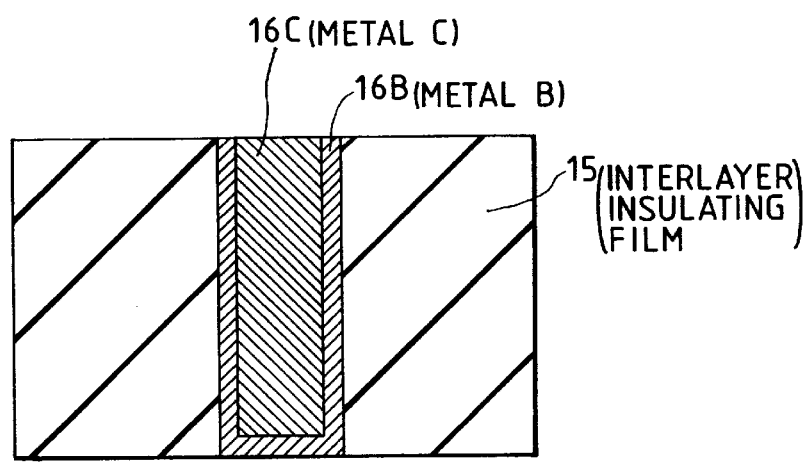
FIG. 44
FIG. 45
| METAL A | METAL B | METAL C |
|---------|---------|---------|
| W       | W       | W       |
| WN      | WN      | Aℓ      |
| WSix    | WSix    | Cu      |
| TiN     | TiN     |         |
| TiSix   | TiSix   |         |
| Aℓ      | TiW     |         |
| MoSix   | Ti      |         |

SNCT : STORAGE NODE CONTACT
BLCT : BIT-LINE CONTACT

SEMICONDUCTOR INTEGRATED CIRCUIT DEVICE AND METHOD FOR FABRICATING THE SAME

CROSS-REFERENCE TO RELATED APPLICATION

This application is a divisional of U.S. application Ser. No. 08/962,730, filed Nov. 3, 1999 now U.S. Pat. No. 5,986,299, the entire disclosure of which is incorporated herein by reference.

FIELD OF THE INVENTION

This invention relates to a semiconductor integrated circuit device and a method for fabricating the same and, more particularly, to a semiconductor integrated circuit device having microscopic multilayer wirings and a method for fabricating such a semiconductor integrated circuit device easily and with high precision. This invention is especially effective for application to a DRAM having a logical LSI.

BACKGROUND OF THE INVENTION

In a semiconductor integrated circuit device, particularly a DRAM (dynamic random access memory), it is very important to increase integration and make multilayer wirings microscopic. According to a first conventional approach, disclosed for example, in Laid-open Japanese Patent Application No. 06-120447, the DRAM design is structured to include two plugs, having a reverse trapezoidal cross section and with the bases thereof being smaller than the top, which are directly connected electrically to connect a diffused layer of a MOS transistor and a lower electrode of a capacitor (a storage node electrode) that consists of a polycrystal silicon, in a DRAM memory array portion.

In conventional DRAMs, a storage capacitor is, typically, placed in a lower portion of a bit line or just above it, similarly to the case of the first conventional method, described above. In that case, however, one problem is that a focus margin in photolithography cannot cover a stage difference between a memory array portion and a peripheral circuit portions (an I/O control circuit portion and a decoder portion), posing limitations to microminiaturization. Further, in the case of fabricating an LSI chip containing a logic circuit, in addition to a memory array portion having a capacitor of a DRAM, etc., the above problem creates a major drawback.

Accordingly, there is proposed a structure in which a capacitor is formed above wiring layers for the purpose of eliminating the limitations on microminiaturization by reducing the stage difference described above. For example, according to a second conventional approach, for example, in Laid-open Japanese Patent Application No. 06-085187, a plug for connecting a diffused layer of a MOS transistor and a lower electrode of a capacitor are formed after wiring layers have been formed.

The first conventional art described above has the problem that because the cross section of the plugs is of reverse trapezoid shape with the sides not vertical and the top area large, the plugs occupy a large area and an area per memory cell increases. Although a polysilicon film is used as a lower electrode of a capacitor of the memory cell array portion, because smaller resistance is required for use as plugs of peripheral circuit portions and a logic circuit portion, a metallic film such as a tungsten film, etc. is usually used. Accordingly, the memory cell array portion, the peripheral circuit portions, and the logic circuit portion require that plugs made of mutually different materials be formed through processes different for each of them, increasing the number of process steps.

Thus, the conventional arts cannot solve three problems simultaneously: (1) making a memory array portion microscopic; (2) lowering the resistance of plugs of peripheral circuit portions and a logic circuit portion; and (3) lowering fabrication cost.

On the other hand, as with the second conventional art, in the case of forming a plug for connecting a diffused layer of a MOS transistor and a lower electrode of a capacitor after forming a wiring layer, although there are required the process to form holes with a large aspect ratio and the process to form plugs by padding the holes with a metallic film, the processes are technically difficult, making it difficult to obtain satisfactory results. Especially when the depth of a connection hole exceeds 1.0 $\mu$m, the formation of the hole and the padding of a metallic film becomes very difficult, a yield decreases, and fabrication cost increases. This method requires a large alignment margin for layer alignment among multiple layers in photolithography performed to form connection holes, so that a unit memory cell area increases.

SUMMARY OF THE INVENTION

Accordingly, an object of the invention is to provide a semiconductor integrated circuit device the memory cell array portion of which is made microscopic.

Another object of the invention is to provide a semiconductor integrated circuit device in which the resistance of plugs of peripheral circuit portions and a logic circuit is loared.

A further object of the invention is to provide a method for fabricating a semiconductor integrated circuit device which has capacitors of a DRAM, etc. that contribute to reduction in fabrication cost.

A still further object of the invention is to provide a method for fabricating a semiconductor integrated circuit device which is of such a structure that a capacitor is placed above a wiring layers without forming holes with a large aspect ratio and padding such holes with a conductive film.

To achieve the above objects, a semiconductor integrated circuit device of the invention is characterized in that a semiconductor body thereof includes peripheral circuit portions comprising an I/O control circuit portion and a decoder portion, and a memory cell array portion, wherein a diffused layer (source drain region) of an insulated gate field effect type transistor (select transistor) formed in the memory cell array portion is electrically connected with a lower electrode of a capacitor formed on a plurality of interlayer insulating films formed in layers on the transistor, through a plurality of plugs directly connected in sequence by penetrating each of the interlayer insulating films, and wherein a plurality of plugs formed in the peripheral circuit portions are mutually connected through wirings or contact pads for wiring.

Namely, as shown in FIG. 3, for example, a plurality of interlayer insulating films 8, 12, 15, and 18 are formed in layers on a MOS transistor formed in a semiconductor substrate 1 and a storage capacitor is formed on the plurality of interlayer insulating films. A lower electrode 20 of the storage capacitor is electrically connected with a diffused layer 3 of the MOS transistor through a plurality of plugs 10, 13, 16, and 19 directly connected in sequence by penetrating each of the plurality of interlayer insulating layers.

Since the plugs 10, 13, 16, and 19 are directly connected in sequence without using the intermediary of contact pads, the occupied area of contact is reduced. Although the small connection area increases a little the resistance among the plugs 10, 13, 16, and 19, this is a trivial problem with the use as storage node contact plugs.

Moreover, according to the invention, the plurality of plugs 10, 13, 16, and 19 are formed by penetrating each of the plurality of interlayer insulating films 8, 12, 15, and 18 formed in layers. Forming a connection hole in a thick interlayer insulating film and forming a plug by padding the connection hole with metal increases the aspect ratio of the connection hole, making it difficult to form the connection hole and pad it with metal. According to the invention, however, for each of a plurality of thin interlayer insulating films instead of a thick interlayer insulating film, a connection hole is formed and metal is padded. Hence, the aspect ratio of each connection hole becomes small and the formation of connection holes and the padding by metal are extremely facilitated. Accordingly, it is easy to obtain such a device structure that a capacitor is placed above wiring layers.

On the other hand, in peripheral circuit portions, as shown in FIG. 4, because plugs 10, 13, 16, and 19 are mutually connected through contact pads 11, 14, and 17, respectively, connection resistance can be sufficiently loared and the peripheral circuit portions can obtain an adequate current. Yet, the memory cell array portion and the peripheral circuit portions can be formed simultaneously through identical processes although they are different in structure, and extra processes need not be added.

A semiconductor integrated circuit device of the invention can include a logic circuit portion, in addition to the memory cell array portion, the I/O control circuit portion, and the decoder portion as described above. Since the logic circuit portion need not be made extremely microscopic as in the memory array portion, even if wirings 11, 14, and 17, or contact pads are placed between plugs 10 and 13, between 13 and 16, and between 16 and 19, respectively, as shown in FIG. 4, for example, no special problem will occur.

The contact plugs formed in the peripheral circuit portions and the memory array portion are made of identical metals. Accordingly, the plugs in the peripheral circuit portions and the memory array portion can be formed simultaneously through identical processes, and this fact is very advantageous in terms of practical use. As these metals, at least one kind of metal selected from a group of tungsten, tungsten nitride, titanium, and titanium nitride can be used.

It is desirable that the size of the top of the plugs is substantially equal to that of the bottom thereof and the sides of the plugs are substantially vertical to the bottom thereof. Namely, any of the sides of the plugs is not slanted and is almost vertical to the bottom thereof, as shown in FIGS. 3 and 4, for example. Therefore, not only are the plugs free from fear of increased connection resistance due to the fact that the size of the top of each plug is almost equal to that of the bottom and the area of the bottom is small, but also the occupied area of contact does not increase because the area of the top does not become large, and microminiaturization and design freedom are not hindered.

Further, the memory cell array portion may be used as a DRAM memory cell array portion, for example. If the unit memory cell of the DRAM memory cell array portion comprises one MOS transistor and one storage capacitor and the area of the memory cell is equal to or less than 8×f×(f+a) (f is critical dimension and a is process latitude), especially desirable results will be obtained.

The capacitor formed on the memory cell array portion may be placed above a bit line and may be placed above all wiring layers. As the capacity insulating film of the capacitor, at least one kind of ferroelectric thin film selected from a group of tantalum oxide, PZT [Pb(Zr, Ti)O$_3$] film, and BST [(Ba, Sr)TiO$_3$] film can be used, so that a capacitor insulating film having an adequately high dielectric constant is obtained.

The memory array cell array portion may be constituted as a DRAM memory cell array portion, instead of a memory cell array portion of ferroelectric memory. In this case, if a ferroelectric film such as a PZT or BST film is used as a capacitor insulating film of ferroelectric capacitor, more desirable results can be obtained. Metallic films can be used equally as upper and lower electrodes of the storage capacitors and ferroelectric capacitors.

If the film thickness of each of the plurality of interlayer insulating films is greater than or equal to 0.3 μm and less than or equal to 1.0 μm, desirable results will be obtained. Since the film thickness being less than 0.3 μm will cause pin hole or the like to be liable to occur, and reduce reliability as insulating films, it is desirable a film thickness to be 0.3 μm or more. If the film thickness is less than or equal to 1.0 μm, aspect ratio will not become so large and the formation of connection holes and the padding of the connection holes by conductive films will be facilitated.

A semiconductor integrated circuit device of the invention can be fabricated by a method described below. A first interlayer insulating film is formed on the surface of a semiconductor substrate, a first connection hole is formed by selectively removing a predetermined portion of the first insulating film, the sides of the first connection hole being substantially vertical to the bottom thereof, a first plug is formed by padding the first connection hole with a metallic film, then a second interlayer insulating film is formed on the first insulating film, a second connection hole is formed by selectively removing a predetermined portion of the second insulating film, the sides of the second connection hole being substantially vertical to the bottom thereof, and a second plug directly connected with the first plug is formed by padding the second connection hole with a metallic film.

According to this fabrication method, the first and second connection holes whose aspect ratio is not large are formed and first and second plugs each having a small aspect ratio are formed so that they are directly connected mutually by padding each of them with a conductive film. In this way, a plug having a large aspect ratio as a whole can be formed. In this case, because a connection hole having a large aspect ratio need not be formed on an interlayer insulting film, and such a connection hole having a large aspect ratio need not be padded with a conductive film, it is easy to form a plug having a large aspect ration as a whole.

Further, a MOS transistor can be formed on a semiconductor substrate before the first interlayer insulating layer is formed, and the first connection hole can be formed so that the surface of a diffused layer of the MOS transistor is exposed.

Polishing the surface of each of the first and second interlayer insulating films is convenient for implementing subsequent processes, and can be carried out by a chemical mechanical polishing (CMP) method.

In this case, if the second interlayer insulating film is formed on a film on which a polishing rate by the chemical mechanical polishing method is smaller than that on the second interlayer insulating film, the film on which the polishing rate is smaller serves as a stopper film of chemical mechanical polishing, contributing to controlled execution of chemical mechanical polishing. By using a silicon nitride film as a film on which the polishing rate is small, desirable results are obtained.

Beneath the second interlayer insulating film can be placed a film on which an etching rate by dry etching is smaller than that on the second interlayer insulating film. When the second connection hole is formed, after a predetermined portion of the first interlayer insulating film is selectively removed until the surface of a film on which the etching rate is smaller is exposed, if the exposed portion of the film on which the etching rate is smaller is removed, the opening can be formed with the minimum influence on a lower layer.

A silicon nitride film can be used as a film on which the etching rate is small, and the same film can be used as a film on which the polishing rate is small and a film on which the etching rate is small.

The process of padding the connection hole with the metallic film can be carried out by using the selective CVD method, which permits minimizing deposition of a metallic film outside an opening, while the CVD method can also be used. After padding the connection hole with the metallic film, polishing protrusions of the metallic film to make the surface thereof flat is convenient for subsequent processes. Use of the chemical mechanical polishing for the flattening process will bring about preferable results.

If the film thickness of each of the first and second of interlayer insulating films is greater than or equal to $0.3\ \mu m$ and less than or equal to $1.0\ \mu m$, desirable results will be obtained. The film thickness being less than $0.3\ \mu m$ will cause pin hole, etc. and reduce insulation capability. If the film thickness is less than or equal to $1.0\ \mu m$, the formation of connection holes and the padding of the connection holes with metallic films will be facilitated.

A semiconductor integrated circuit device of the invention can include the memory cell array portion, I/O control circuit, decoder portion, and logic circuit portion. Although the depth of plugs is different between the memory cell array portion and other peripheral circuit portions, the invention permits simultaneously forming plugs with different depths.

Moreover, in the memory cell array portion, the plurality of plugs are directly connected in sequence, while, in peripheral circuit portions, the plurality of plugs are not directly connected, but a wiring layer and a contact pad intervene between plugs. Yet, such different structures are formed simultaneously through identical processes.

Well-known films such as a multilayer film consisting of, e.g., a titanium film, a titanium nitride film, and a tungsten film, and a multilayer film consisting of, e.g., a tungsten film, an aluminum film, and a titanium nitride film can be used as the plug and the wiring, respectively. Also, well-known insulating films such as silicon oxide films and BPSG films may be used as interlayer insulating layers.

As the capacitor, normal storage capacitors or ferroelectric capacitors using ferrodielectric substance can be used equally, and well-known films can also be used as capacitor insulating films.

The film thickness of each of a plurality of interlayer insulating films in which a plurality of plugs are formed is preferably greater than or equal to $0.3\ \mu m$ and less than or equal to $1.0\ \mu m$, and connection holes can be formed in these interlayer insulating layers by using the photolithography method and the dry etching method that are well-known. In this case, if an etching method with high anisotropy, such as reactive ion etching is used, connection holes whose sides are almost vertical to the bottom thereof can be formed with high precision.

The process of padding the connection hole with metal to form a plug should be carried out preferably by the selective CVD method, but in the invention, because the film thickness of interlayer insulating films is small and the aspect ratio of connection hole is not large, the connection hole can also be easily padded by the CVD method.

Flattening the surface after padding the connection hole is desirable for implementing subsequent processes. The most desirable method for flattening the surface is the chemical mechanical polishing method, which permits simultaneous flattening of the surface of plugs of different depths (thickness) formed on each of a memory cell array portion and peripheral circuits. Abrasives used for the chemical mechanical polishing method are appropriately selected depending on materials to be polished; those well-known can be used.

The chemical mechanical polishing method is also very effectively used to flatten the surface of interlayer insulating films. In this case, if a film on which a polishing rate by the chemical mechanical polishing method is smaller is placed beneath the interlayer insulating film to be flattened by polishing the surface, and the chemical mechanical polishing is performed for the interlayer insulating film to be polished, because the lower film serves as a stopper film for the chemical mechanical polishing, adverse effect on the lower layer is prevented and the chemical mechanical polishing can be extremely easily performed with high precision.

As is the case with the above mentioned chemical mechanical polishing, the connection hole can also be formed using an etching stopper film. As the stopper films for chemical mechanical polishing and etching films, an identical kind of film can be used and the use of silicon nitride film is most desirable.

BRIEF DESCRIPTION OF THE DRAWINGS

FIG. 43 shows an enlarged cross-sectional view of a plug within a circle A shown in FIG. 3.

FIG. 44 shows an enlarged cross-sectional view of a variation example of a plug within a circle A shown in FIG. 3.

FIG. 45 shows a table of constituent materials applied to plugs shown in FIGS. 43 and 44.

DETAILED DESCRIPTION OF THE PREFERRED EMBODIMENTS

Embodiments of the invention will be described in detail with reference to the accompanying drawings.

Embodiment 1

This embodiment relate to a case where the invention is applied to a DRAM semiconductor integrated circuit device having three wiring layers. A 256 Mbit DRAM with a minimum processing dimension of 0.2 µm and a unit memory cell size of 0.8×0.6 µm is fabricated.

Figure 1:
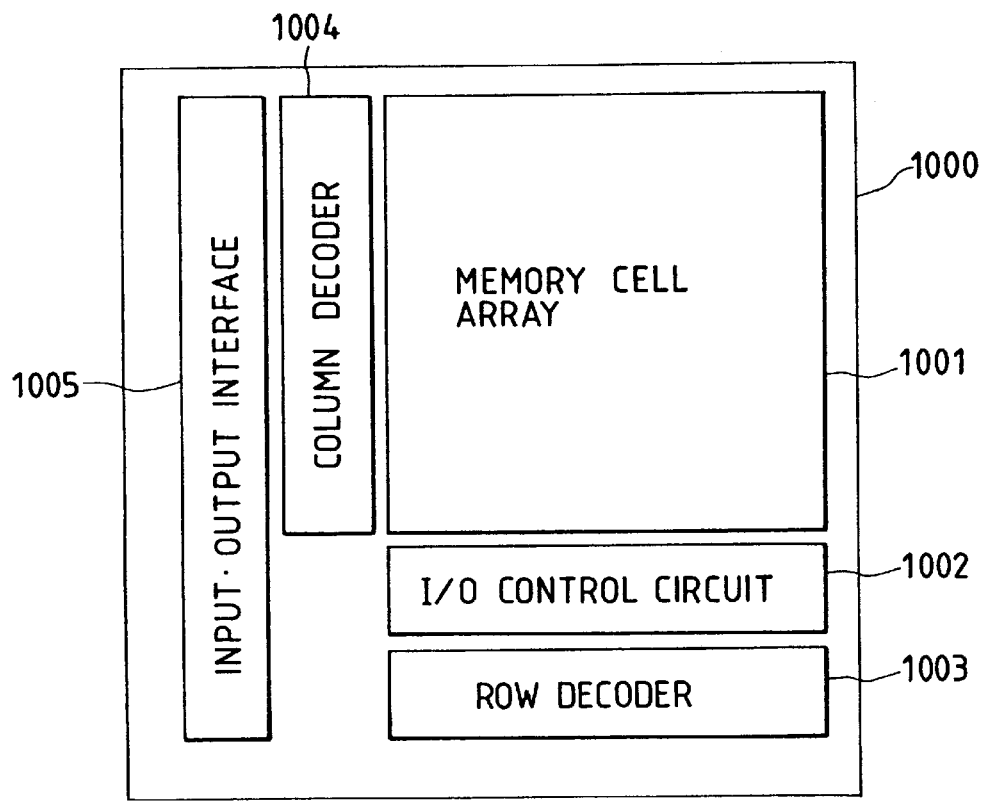
FIG. 1 shows the overall structure of a DRAM chip.

FIG. 1 shows the overall structure of a DRAM semiconductor integrated circuit device according to this embodiment. A DRAM chip 1000 consists of a memory cell array portion 1001, an I/O control circuit portion 1002, a row decoder portion 1003, a column decoder portion 1004 and an input-output interface portion 1005.

Figure 2:
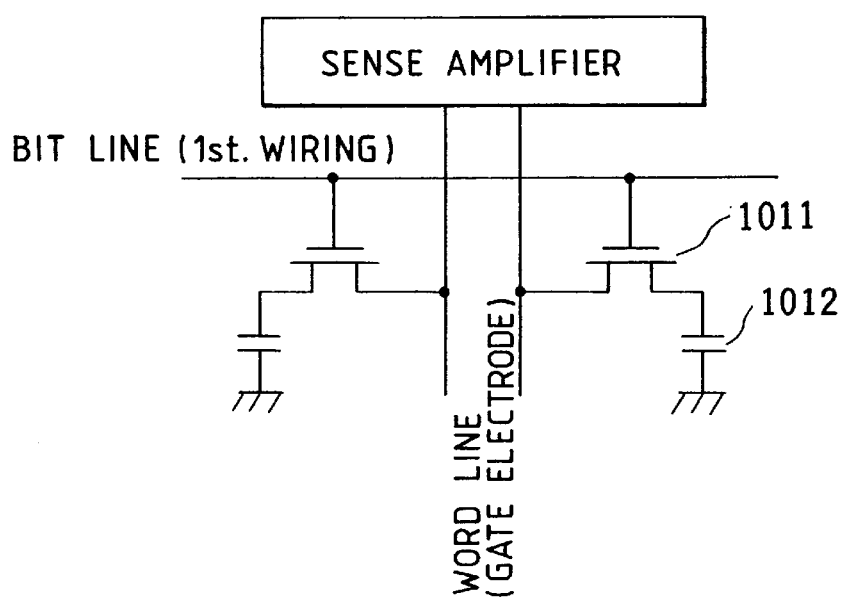
FIG. 2 shows an equivalent circuit of a DRAM memory array portion.

FIG. 2 shows a 2-bit equivalent circuit of memory cells constituting the memory cell array portion 1001. A memory cell consists of an insulated gate field effect type transistor (specifically, a MOS transistor) 1011 and a storage capacitor 1012.

Figure 3:
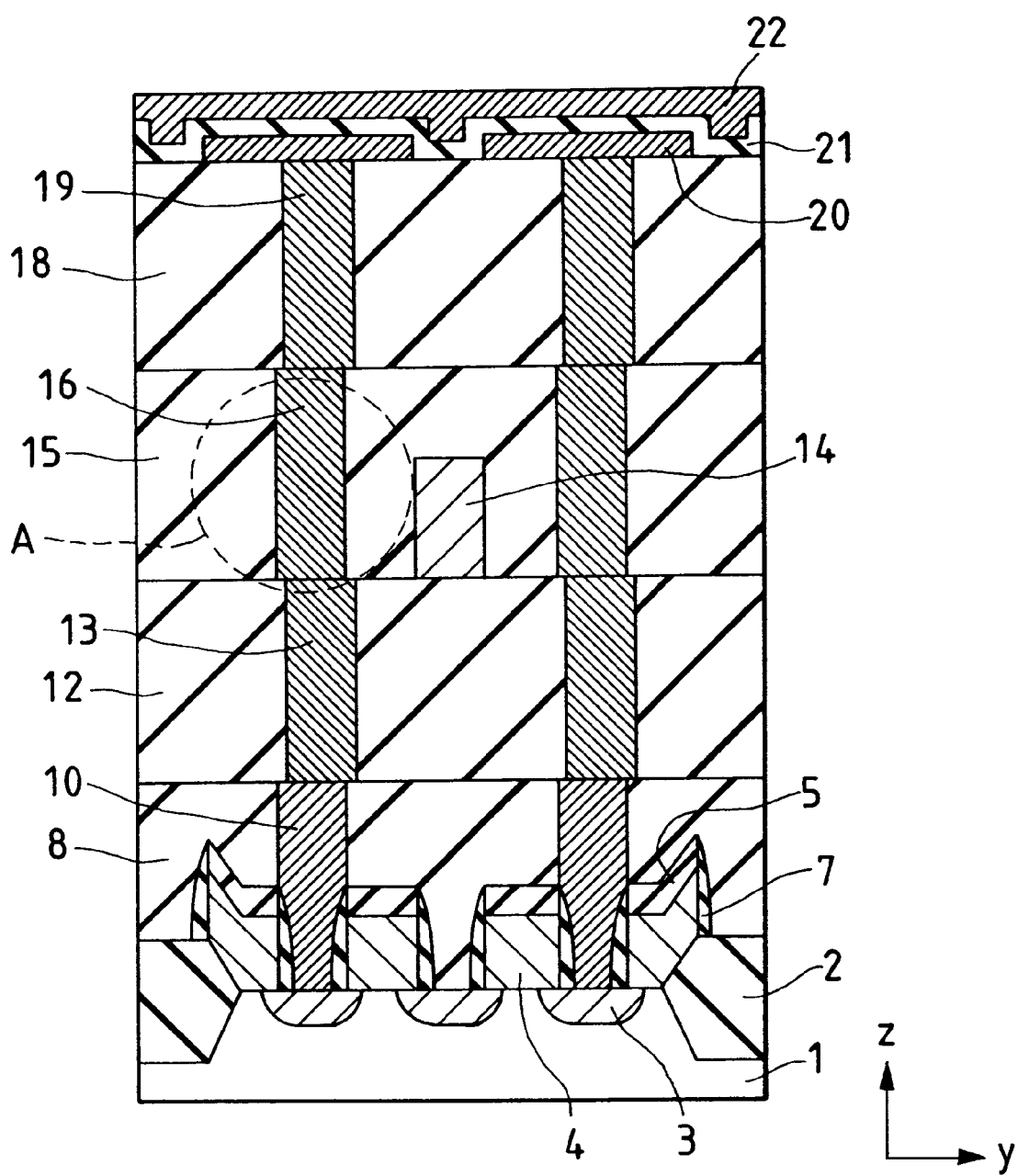
FIG. 3 shows a cross-sectional view taken in B–B' line of a memory cell array portion shown in FIG. 6 according to the embodiment 1 of the invention.
Figure 4:
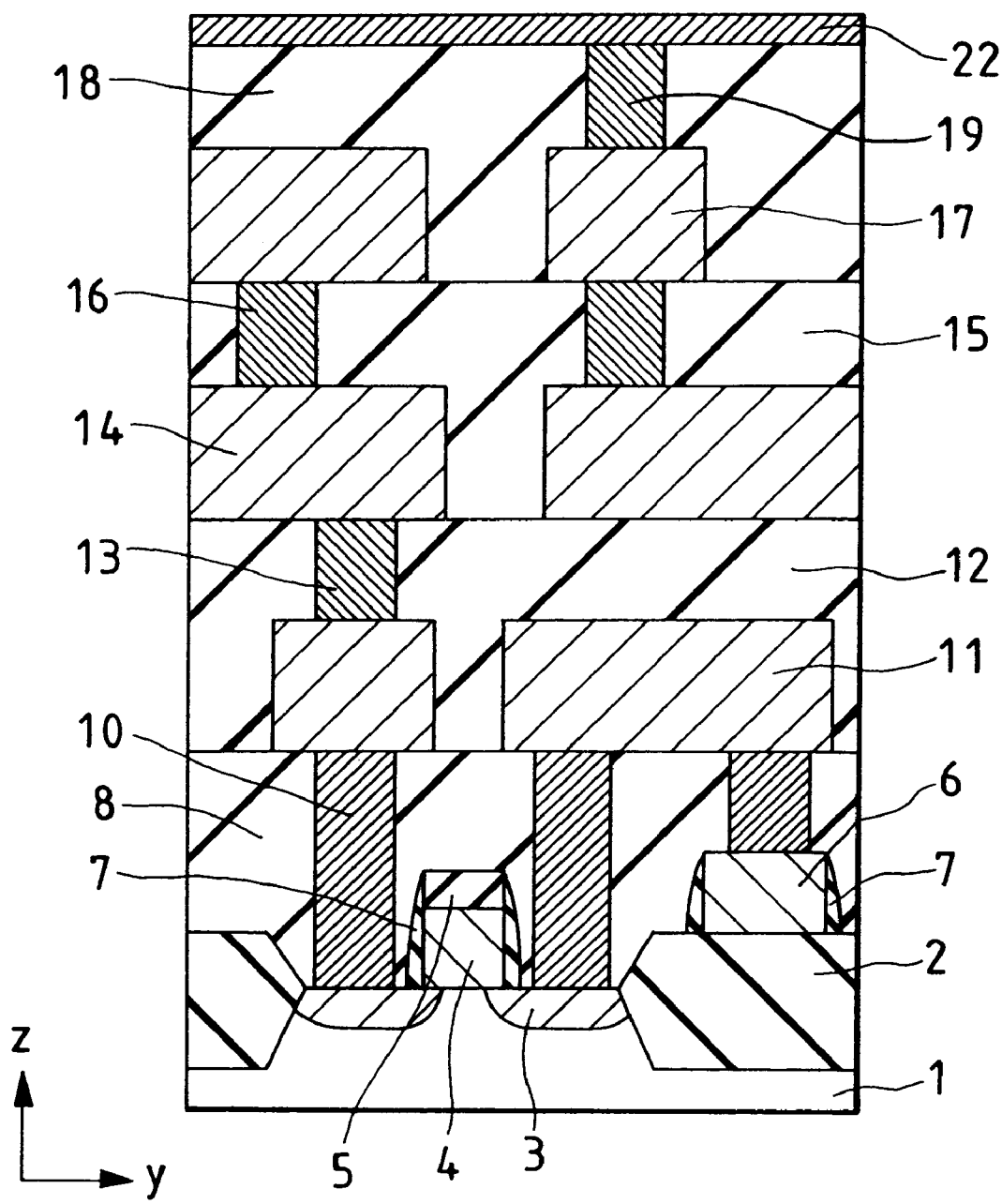
FIG. 4 shows a cross-sectional view of peripheral circuit portions according to the embodiment 1 of the invention.
Figure 5:
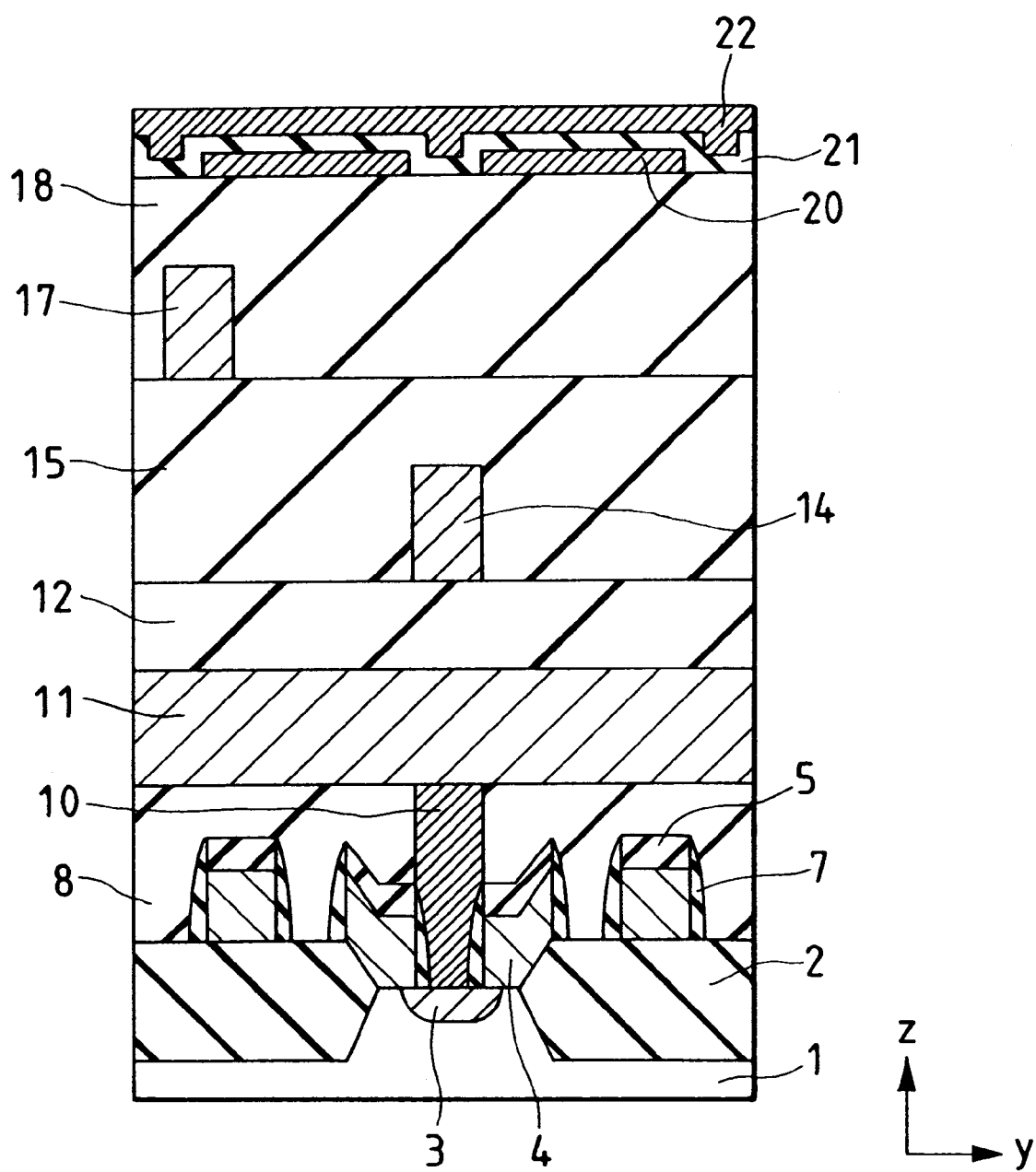
FIG. 5 shows a cross-sectional view taken in A–A' line of a memory cell array portion shown in FIG. 6 according to the embodiment 1 of the invention.
Figure 6:
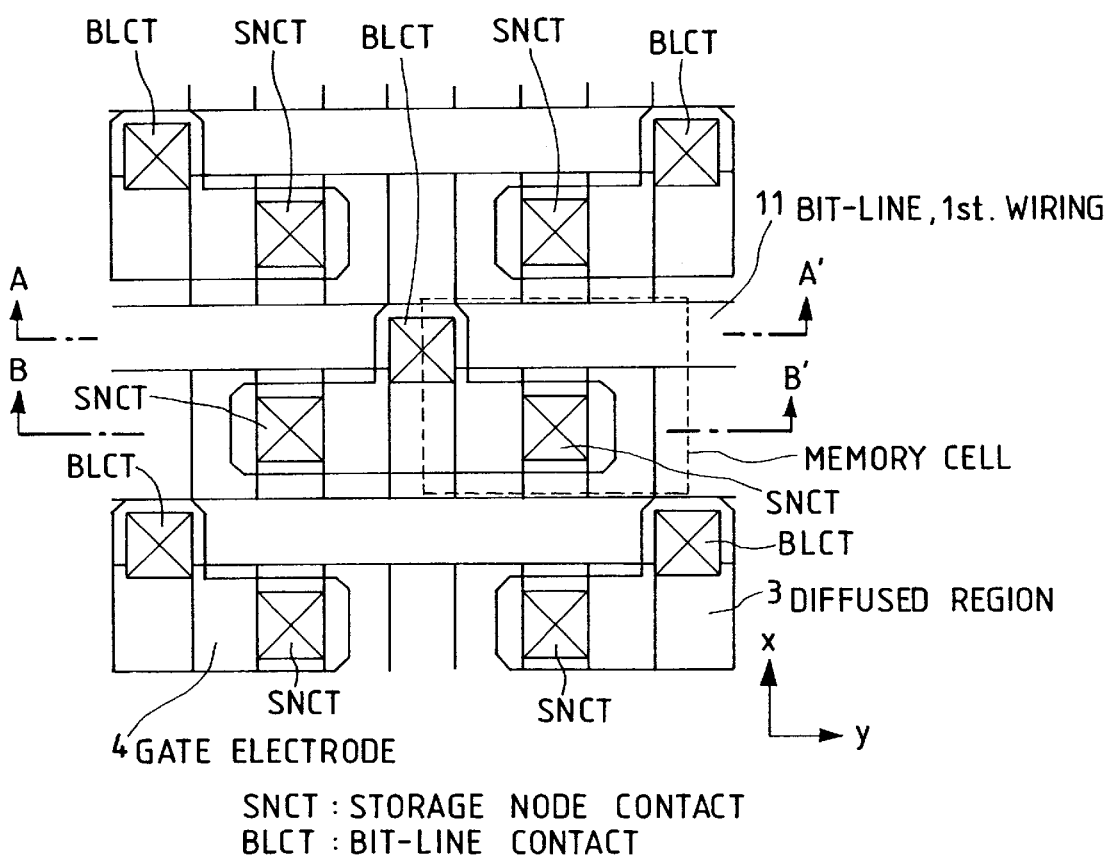
FIG. 6 shows a top view of a DRAM memory cell array portion according to the embodiment 1 of the invention.
Figure 46:
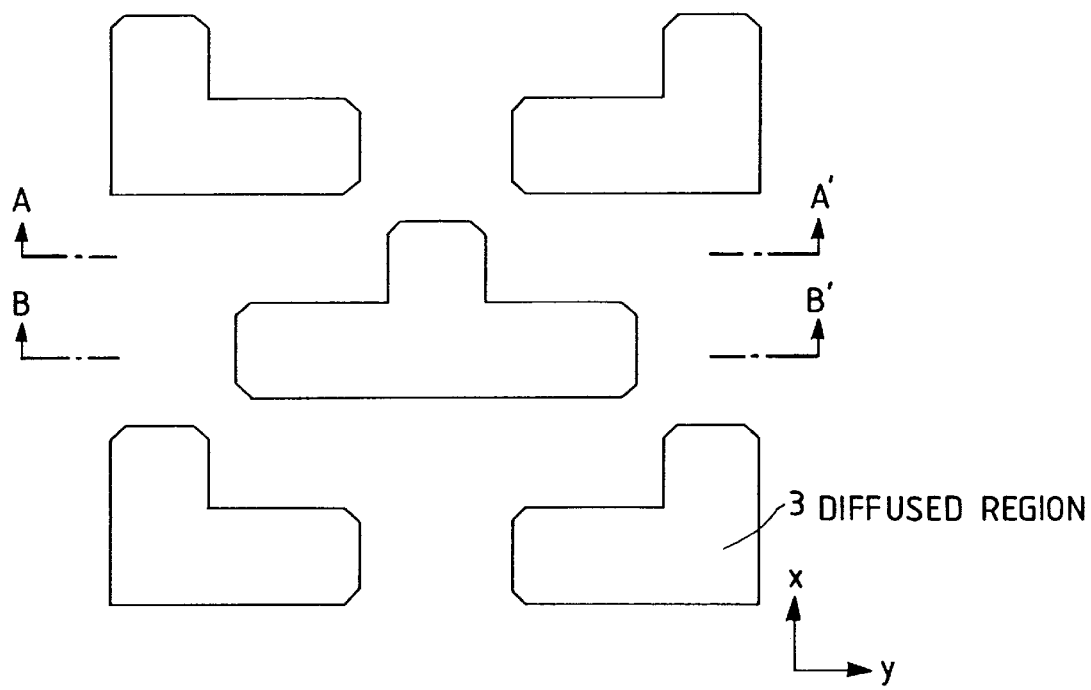
FIG. 46 is an exploded view showing the placement relationship of diffused layers 3 in FIG. 6.
Figure 47:
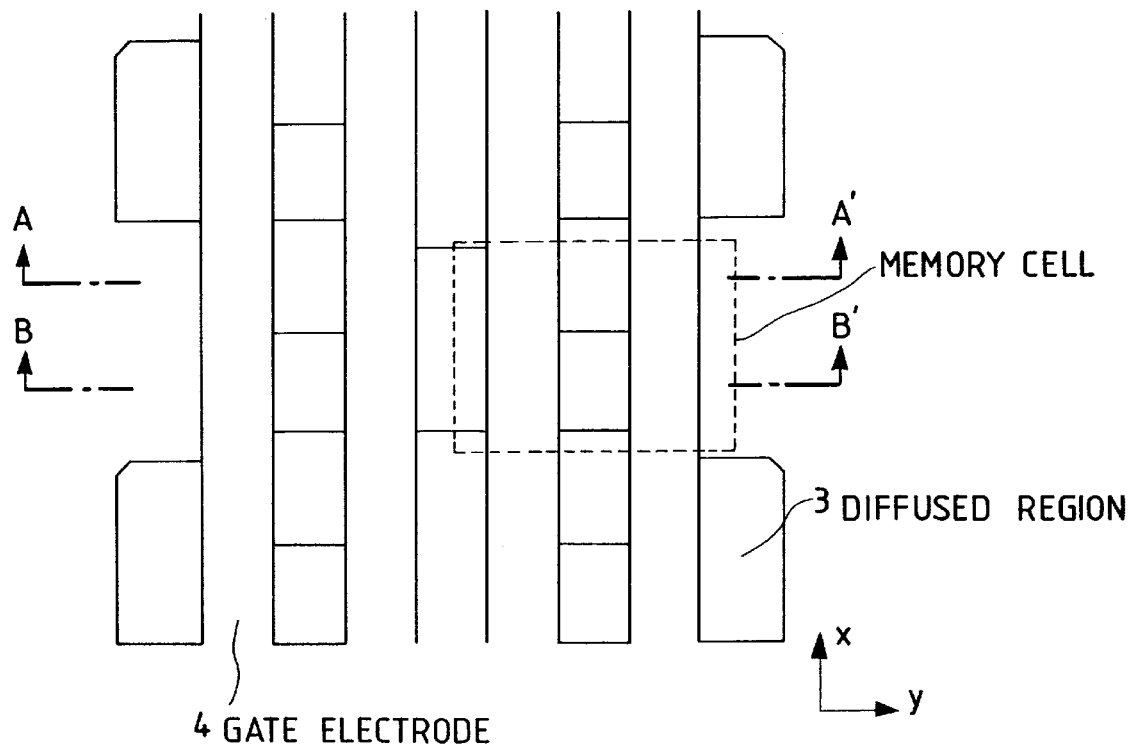
FIG. 47 is an exploded view showing the placement relationship of gate electrodes 4 in FIG. 6.
Figure 48:
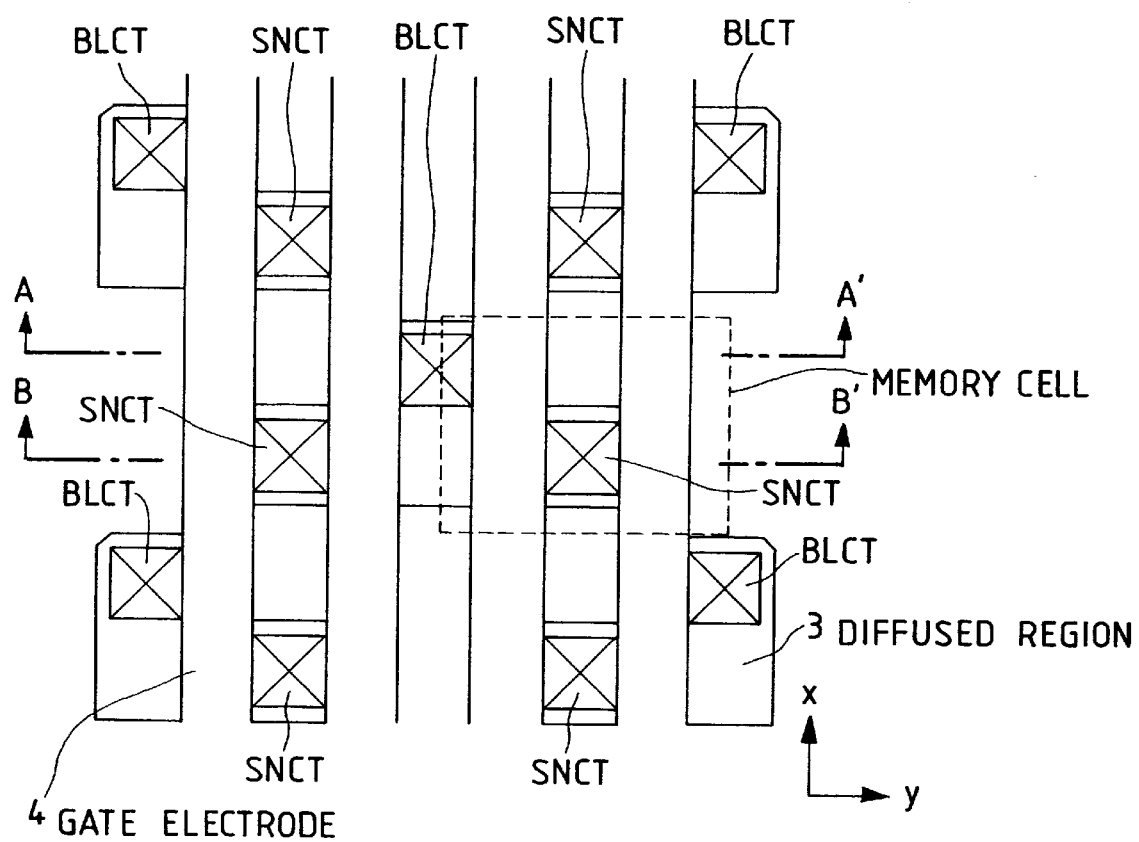
FIG. 48 is an exploded view showing the placement relationship of SNCTs (storage node contacts) and BLCTs (bit line contacts) in FIG. 6.
Figure 49:
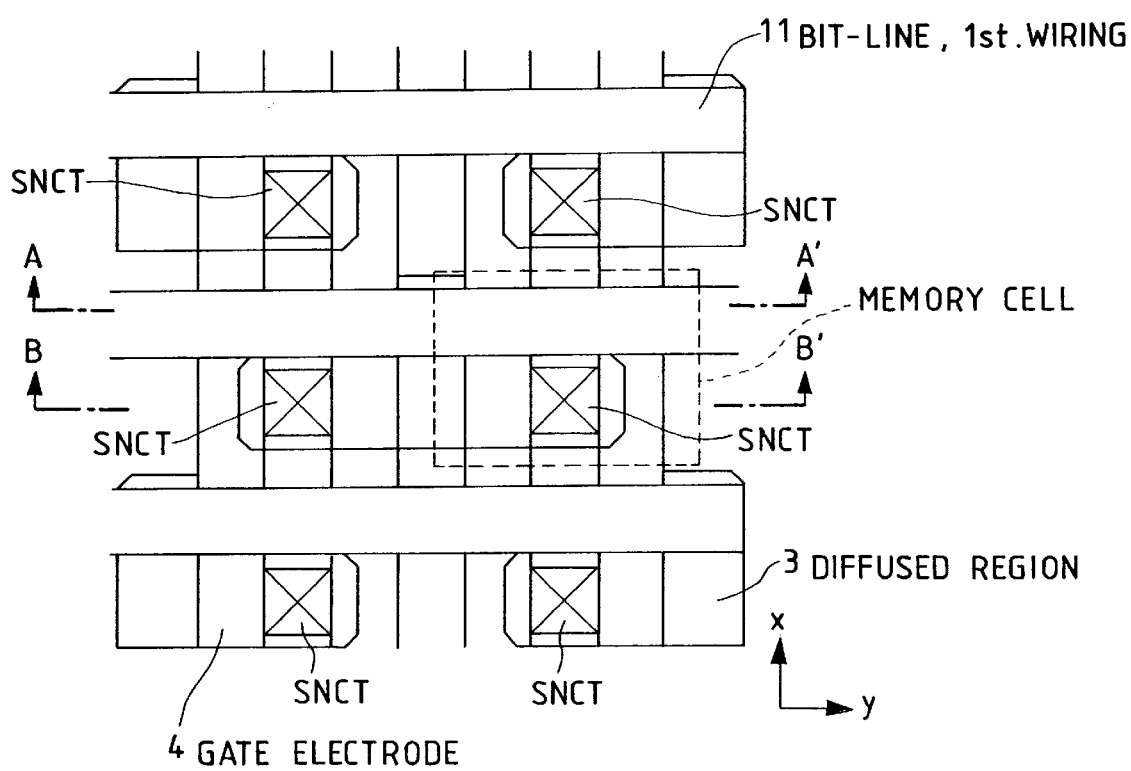
FIG. 49 is an exploded view showing the placement relationship of a bit line (first layer wiring) 11 in FIG. 6.

FIGS. 3, 4, and 5 each show a cross-sectional view of a main portion of DRAM according to this embodiment. FIGS. 3 and 5 each show a memory cell array portion, and FIG. 4 shows peripheral circuit portions. FIG. 6 is a top view of a DRAM memory cell array portion according to this embodiment, and shows a plane placement when up to a first-layer wiring 11 in FIGS. 3, 4, and 5 is formed. The cross-sectional structure of the memory cell array portion shown in FIG. 5 is the one along an A–A' line in FIG. 6, and the cross-sectional structure of the memory cell array portion shown in FIG. 3 is the one along a B–B' line in FIG. 6. FIGS. 46 to 49 show the placement relationship of each of layers in FIG. 6. Namely, FIG. 46 shows the placement relationship of diffused layers 3 in FIG. 6, FIG. 47 shows the placement relationship of gate electrodes 4 in FIG. 6, FIG. 48 shows the placement relationship of SNTCs (storage node contacts) and BLTCs (bit line contacts) in FIG. 6, and FIG. 49 shows the placement relationship of a bit line (first-layer wiring) 11 in FIG. 6.

As can be seen from FIGS. 3, 4, and 5, a silicon oxide film 2 for element isolation, a diffused layer (source drain region) 3, and a gate electrode 4, and the like, are formed on a silicon substrate and further on top of the layer, wiring layers consisting of first-layer to third-layer wirings 11, 14 and 17, first to fourth plugs 10, 13, 16, and 19, and first to fourth interlayer insulating films 8, 12, 15, and 18 are formed.

In the memory cell array portion, the first wiring 11 functions as a bit line placed in an orthogonal direction of the gate electrode 4, and the second wiring 14 functions as a subword line placed in the same direction as the gate electrode 4. Above these is placed a storage capacitor consisting of a lower electrode 20, a capacity insulating film 21, and an upper electrode 22.

In the memory cell array portion, the first to fourth plugs 10, 13, 16, and 19 whose cross-sectional dimension (square in photomask design) is designed with a minimum processing dimension of 0.2 µm are directly connected electrically and in sequence without using the intermediary of wirings and wiring pads so that the diffused layer 3 of the MOS transistor and the lower electrode of the storage capacitor are mutually connected through the first to fourth plugs 10, 13, 16, and 19. Although not shown in the figures, below the gate electrode 4 is formed a gate oxide film of 10 nm or less thick.

Since the first plug 10 is formed in self-alignment with the gate electrode 4, the dimension in the y direction in FIG. 6 is reduced up to four times the minimum processing dimension, while the dimension in the x direction is reduced up to three times the minimum processing dimension. Such microminiaturization is achieved because an alignment margin between a wiring pad and the first-layer wiring 11 (bit line) becomes unnecessary in this embodiment although it is required in the case of connecting the first plug 10 and the second plug 13 through the wiring pad. The structure requires no wiring pad achieved reduction in a cell area in the memory cell array portion.

On the other hand, in the peripheral circuit portions shown in FIG. 4, because the first to fourth plugs 10, 13, 16, and 19 are electrically connected mutually through conductors etched by photolithography, that is, wirings and wiring pads, their occupied area is larger than that in the memory array portion, but wiring resistance including the contact resistance among the plugs can be sufficiently loared.

The first to fourth plugs formed in the memory cell array portion and the first to fourth plugs formed in the peripheral circuit portions each are made of identical metals such as a tungsten film and a titanium nitride film and are simultaneously formed. As a result, the number of process steps required and fabrication cost are reduced and the resistance of wirings including the plugs of the peripheral circuit portions is loared. As the materials of the first to fourth plugs, a single metal selected from Metal A shown in FIG. 45 may be used in the case of such a structure as shown in FIG. 43, for example. A combination of two kinds of metals selected one from each of Metal B and Metal C shown in FIG. 45 may be used in the case of such a structure as shown in FIG. 44. Further, a combination of three or more kinds of metals selected at least one from each of Metal B, Metal C, and Metal C may also be used.

As apparent from the above description, DRAM according to this embodiment achieves microminiaturization of a memory cell array portion, reduction in the wiring resistance in peripheral circuit portions, and results in reduction in fabrication cost. In the case of a DRAM according to this embodiment, a semiconductor integrated circuit device that is of such a structure that a capacitor is placed above wiring layers can be fabricated without forming holes with a large aspect ratio and padding such holes having a large aspect ratio with metallic films.

Next, a method for fabricating the DRAM according to the embodiment 1 will be explained.

Figure 7:
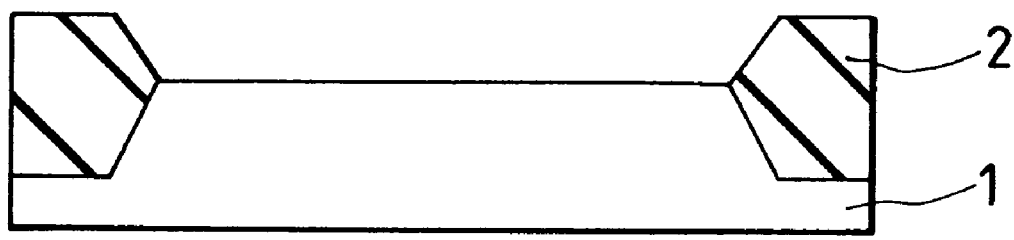
FIG. 7 shows a cross-sectional view of a process for fabricating a memory cell array portion shown in FIG. 3 according to the embodiment 1 of the invention.
Figure 8:
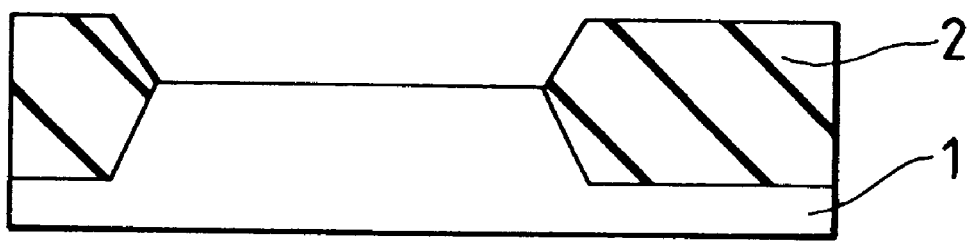
FIG. 8 shows a cross-sectional view of a process for fabricating peripheral circuit portions shown in FIG. 4 according to the embodiment 1 of the invention.

First, as shown in FIGS. 7 and 8, a silicon oxide film (LOCOS film) 2 of 350 nm thick for element isolation, a well layer (not shown in the figures), a channel layer (not shown in the figures), and the like are formed on a p-type (100) silicon substrate 1 by using prior arts such as the thermal oxidation method and the photolithography method. Instead of the LOCOS film, the shallow trench isolation method permitting higher level microminiaturization and flattening may be applied to element isolation.

Figure 9:
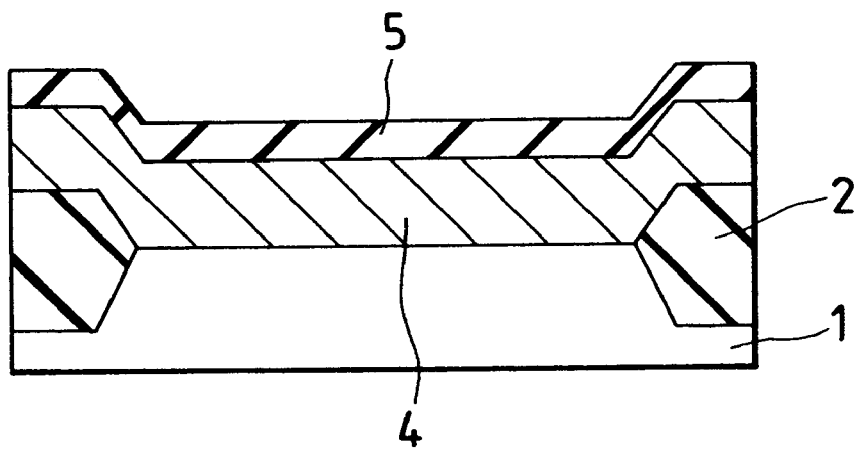
FIG. 9 shows a cross-sectional view of a process for fabricating a memory cell array portion shown in FIG. 3 according to the embodiment 1 of the invention.
Figure 10:
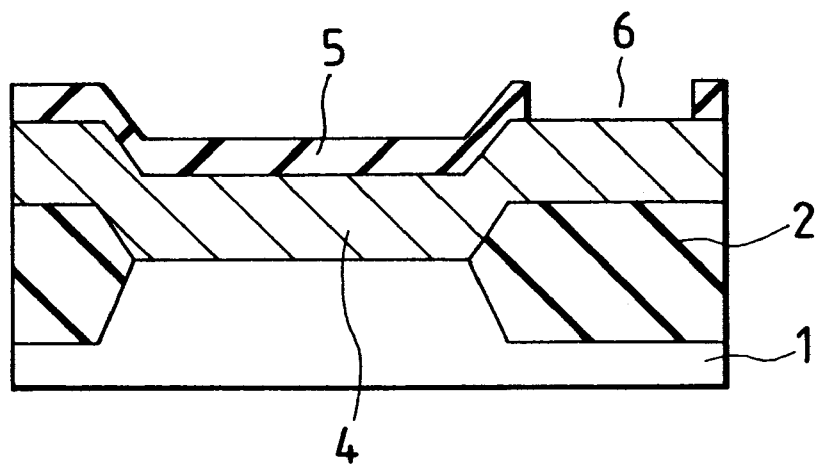
FIG. 10 shows a cross-sectional view of a process for fabricating peripheral circuit portions shown in FIG. 4 according to the embodiment 1 of the invention.

Next, as shown in FIGS. 9 and 10, after forming a gate oxide film (not shown in the figures) of 7 nm thick by using the well-known thermal oxidation method, a multilayer film 4 consisting of a polycrystal silicon film of 70 nm thick doped with phosphorus (P) and a tungsten silicide film of 120 nm thick is formed using the well-known low pressure CVD method. Further, on top of it are formed a silicon oxide film of 10 nm thick and a silicon nitride film of 100 nm thick by the thermal CVD method and the plasma low pressure CVD method, respectively, and a multilayer insulating film 5 is formed. The predetermined portion of the multilayer insulating film 5 is selectively removed using the photolithography method and the dry etching method that are well-known, and a connection hole is formed in a connection area 6 between the multilayer film 4 and a plug, as shown in FIG. 10.

Figure 11:
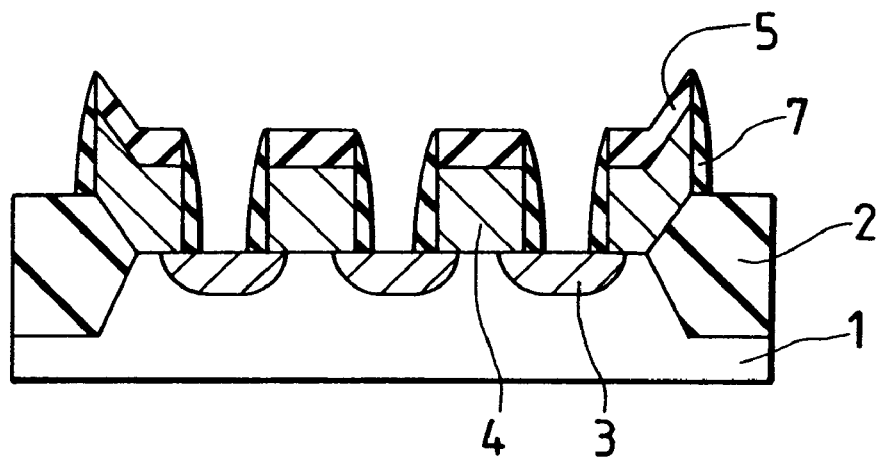
FIG. 11 shows a cross-sectional view of a process for fabricating a memory cell array portion shown in FIG. 3 according to the embodiment 1 of the invention.
Figure 12:
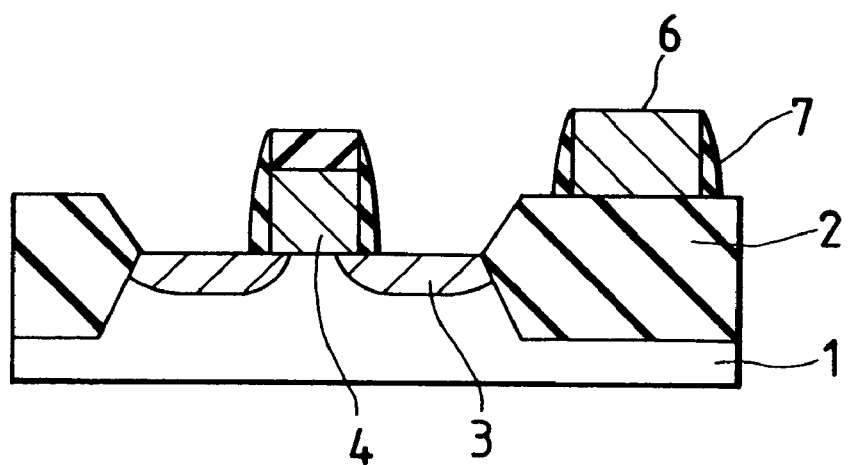
FIG. 12 shows a cross-sectional view of a process for fabricating peripheral circuit portions shown in FIG. 4 according to the embodiment 1 of the invention.

Next, as shown in FIGS. 11 and 12, the multilayer insulating film 5 and the multilayer film 4 are patterned to a predetermined shape using the photolithography method and the dry etching method that are well-known, and a gate electrode 4 with a gate length of 0.2 μm is formed. Next, with the electrode 4 as a mask, n-type impurity ions are implanted using the well-known ion implantation method. Next, after forming a titanium silicon film of 80 nm thick on the whole surface, anisotropic etching is performed by the reactive ion etching method, and side wall spacers 7 with a spacer length of 50 nm are formed, leaving portions formed on the side walls of the gate electrode 4 of the titanium silicon film. Further, ion implantation is performed again with the gate electrode 4 and the side wall spacers 7 as masks, then an n-type diffused layer 3 not subjected to thermal treatment is formed. In FIGS. 11 and 12, the cross-sectional shape of the diffused layer 3 is roughly shown because it does not relate to the invention directly.

Figure 13:
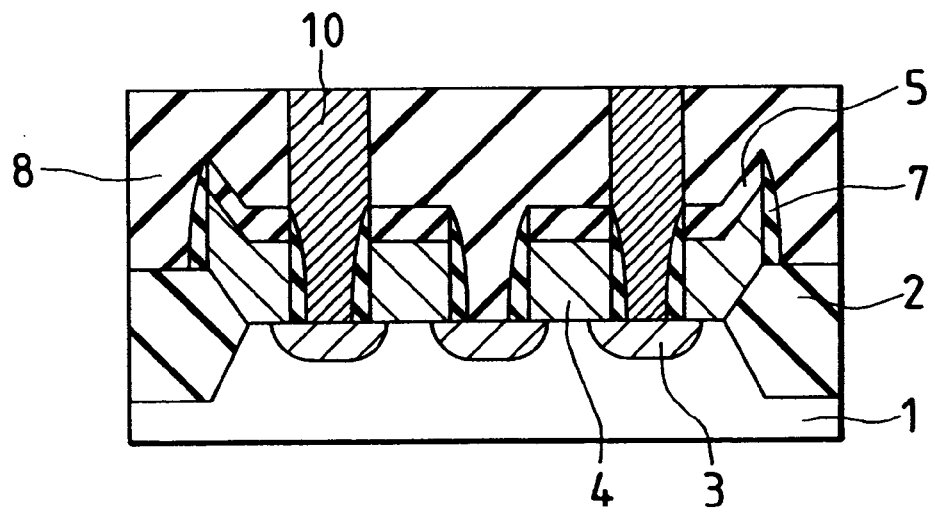
FIG. 13 shows a cross-sectional view of a process for fabricating a memory cell array portion shown in FIG. 3 according to the embodiment 1 of the invention.
Figure 14:
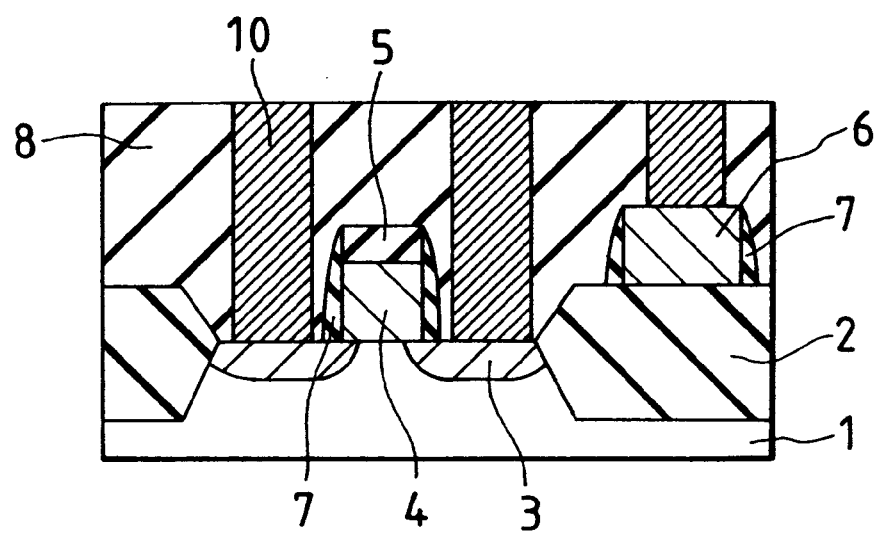
FIG. 14 shows a cross-sectional view of a process for fabricating peripheral circuit portions shown in FIG. 4 according to the embodiment 1 of the invention.

Next, as shown in FIGS. 13 and 14, after forming a BPSG (borophosphosilicale glass) film 8 of 700 nm thick as a first interlayer insulating film, the BPSG film 8 is reflowed by performing thermal treatment. The BPSG film 8 is polished by the well-known CMP method (chemical mechanical polishing method) to flatten the surface and the film thickness above the electrode 4 in an element isolation area is set to 300 nm. Further, contact holes having a diameter of 0.2 μm that reach the diffused layer 3 and gate electrode 4, respectively are simultaneously formed using the photolithography method and the dry etching method that are well-known.

Subsequently, after a titanium (Ti) film of 20 nm thick and a titanium nitride (TiN) film of 30 nm thick are formed in layers by the well-known sputtering method, on top of the layers is formed a tungsten (W) film of 100 nm thick by the well-known CVD method that uses hydrogen ($H_2$) and tungsten hexafluoride ($WF_6$) gases as raw gases. Of the titanium film, titanium nitride film, and tungsten film, a portion formed on the BPSG film 8 is removed by the well-known CMP method, and a first plug 10 is formed leaving these metal films only in the contact hole.

Figure 16:
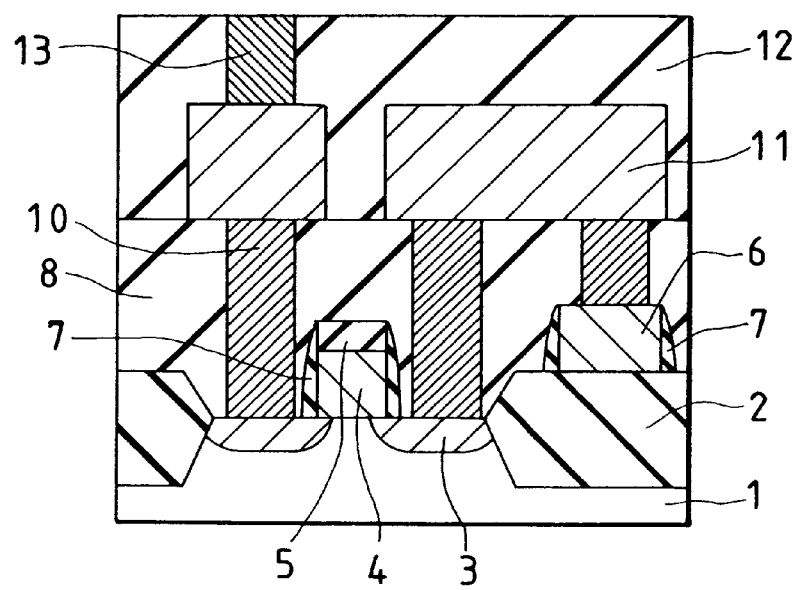
FIG. 16 shows a cross-sectional view of a process for fabricating peripheral circuit portions shown in FIG. 4 according to the embodiment 1 of the invention.

Next, after a tungsten film of 50 nm thick, an aluminum film of 300 nm thick, and a titanium nitride film of 50 nm thick each are formed in sequence on top of each other by the sputtering method, they are patterned to a predetermined shape using the photolithography method and the dry etching method that are well-known, and a first-layer wiring 11 is formed as shown in FIG. 16. The first-layer wiring 11, in a DRAM memory cell array portion, extends in an orthogonal direction of the gate electrode 4 and functions as a bit line.

Figure 15:
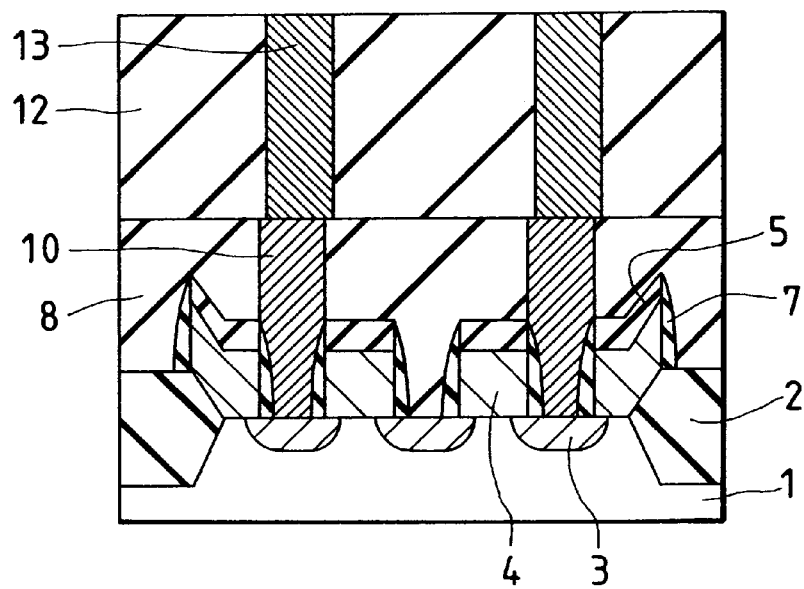
FIG. 15 shows a cross-sectional view of a process for fabricating a memory cell array portion shown in FIG. 3 according to the embodiment 1 of the invention.

In this case, in a connection portion between the first plug 10 and the second plug 13 in the memory cell array portion, the tungsten film, aluminum film, and titanium nitride film are removed by the patterning and the first wiring layer 11 is not formed in that portion. Accordingly, as shown in FIG. 15, in the memory cell array portion, the first plug 10 is directly connected with the second plug 13. As a result, the contact area between the first plug 10 and the second plug 13 is reduced and contact resistance becomes high, but this is a trivial problem because too low a resistance is not required for connection between the diffused layer 3 of MOS transistor and the lower electrode of storage capacitor.

On the other hand, in peripheral circuit portions, as shown in FIG. 16, to reduce the resistance between plugs, two plugs 10 and 13 are mutually connected through the wiring layer (contact pad for wiring) 11 patterned on the first interlayer insulating layer 8. Thus, because the contact resistance and dimension of plug is different between the memory cell array portion and the peripheral circuit portions, the direct connection portion (memory cell array portion) in which the first plug 10 and the second plug 13 are directly connected without using the intermediary of a wiring layer and a contact pad for wiring, and the indirect connection portion (peripheral circuit portions) in which they are indirectly connected through the wiring layer 11 can be simultaneously formed within an identical LSI chip, so that microscopic multilayer wirings having highly stable contact resistance can be obtained.

After forming the first-layer wiring 11, further, as shown in FIGS. 15 and 16, a second interlayer insulating film 12 (an interlayer insulating film between the first-layer wiring 11 and a second-layer wiring) consisting of s silicon oxide film of 600 nm thick is formed by the well-known high density plasma CVD method that uses monosilane ($SiH_4$) and oxygen ($O_2$) gases as raw gases. As a result, a portion in which the first-layer wiring 11 is not formed is padded with the second interlayer insulating film 12.

Next, the second interlayer insulating film 12 is polished by the well-known CMP method until the thickness above the first-layer wiring 11 becomes 200 nm, the surface is flattened, then on top of the film is formed a silicon oxide film of 200 nm thick (not shown in the figure) by the well-known plasma CVD method that uses TEO gases as main gases.

A connection hole is formed in the second interlayer insulating film 12 by using the photolithography method and the dry etching method that are well-known. In the memory cell array portion, the connection hole is formed to penetrate the second interlayer insulating film 12 to allow the top of the first plug 10 to be exposed, while, in the peripheral circuit portions, it is formed to allow the surface of the first-layer wiring 11 to be exposed. A tungsten film of 1 μm thick is formed by the well-known selective CVD method that uses the monosilane and tungsten hexafluoride as raw gases, and the connection hole is padded with the tungsten film. At this time, the connection hole is overfilled with the tungsten film equally in the memory cell portion and the peripheral circuit portions, the overfilled, extra tungsten film and a tungsten film formed on the second interlayer insulating film 12 due to selective lack of deposition are removed by polishing by the CMP method, and the second plug 13 is formed leaving the tungsten film only in the connection hole. By padding connection holes using the selective CVD method and the CMP method in this way, two or more connection holes with different depths are simultaneously padded with tungsten, so that second plugs 13 with different depths can be simultaneously formed in the memory array portion and the peripheral circuit portions. Since the depth of about 0.8 μm in connection holes is not so large, excellent plugs free from empty holes or the like can be formed.

Figure 17:
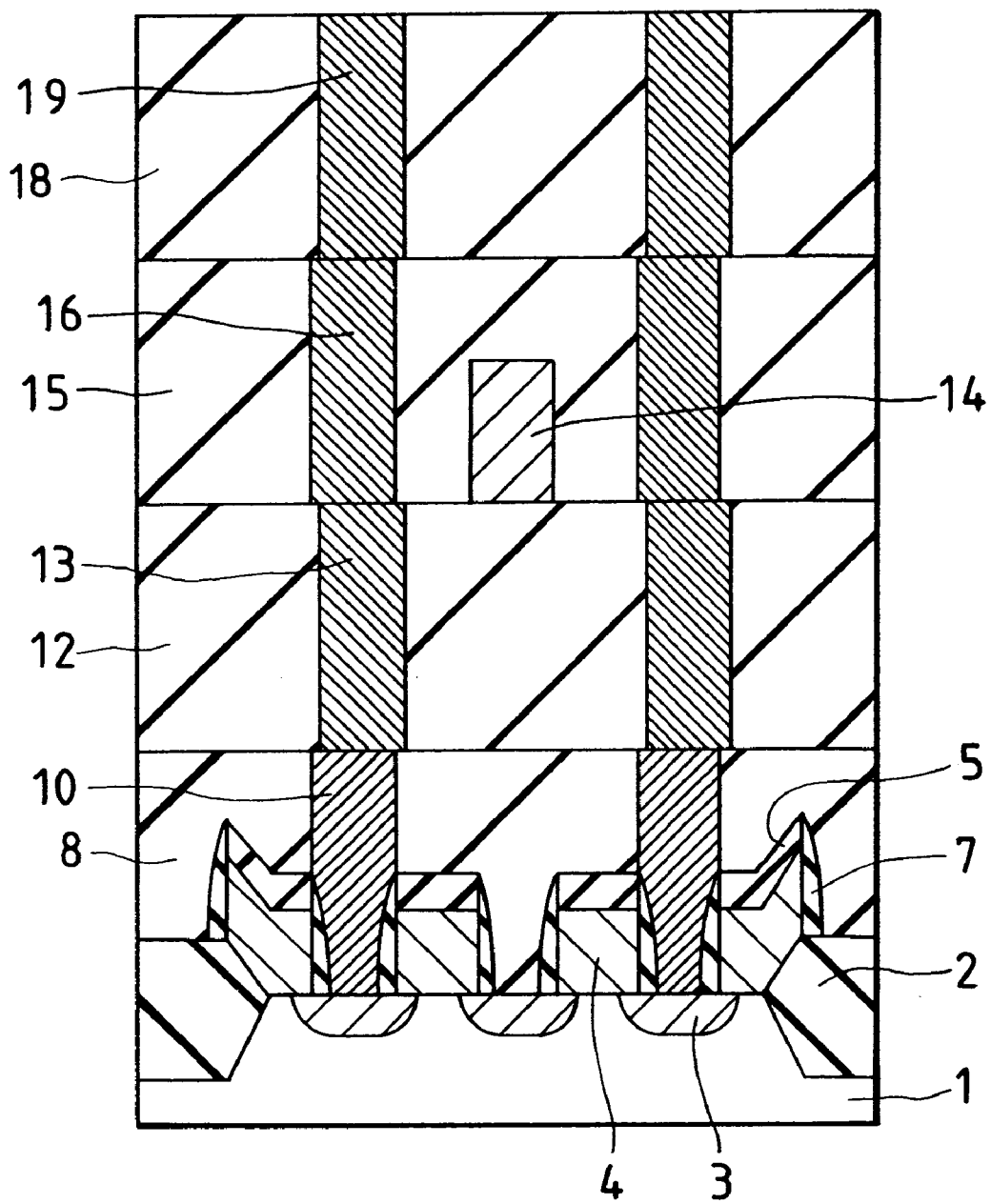
FIG. 17 shows a cross-sectional view of a process for fabricating a memory cell array portion shown in FIG. 3 according to the embodiment 1 of the invention.
Figure 18:
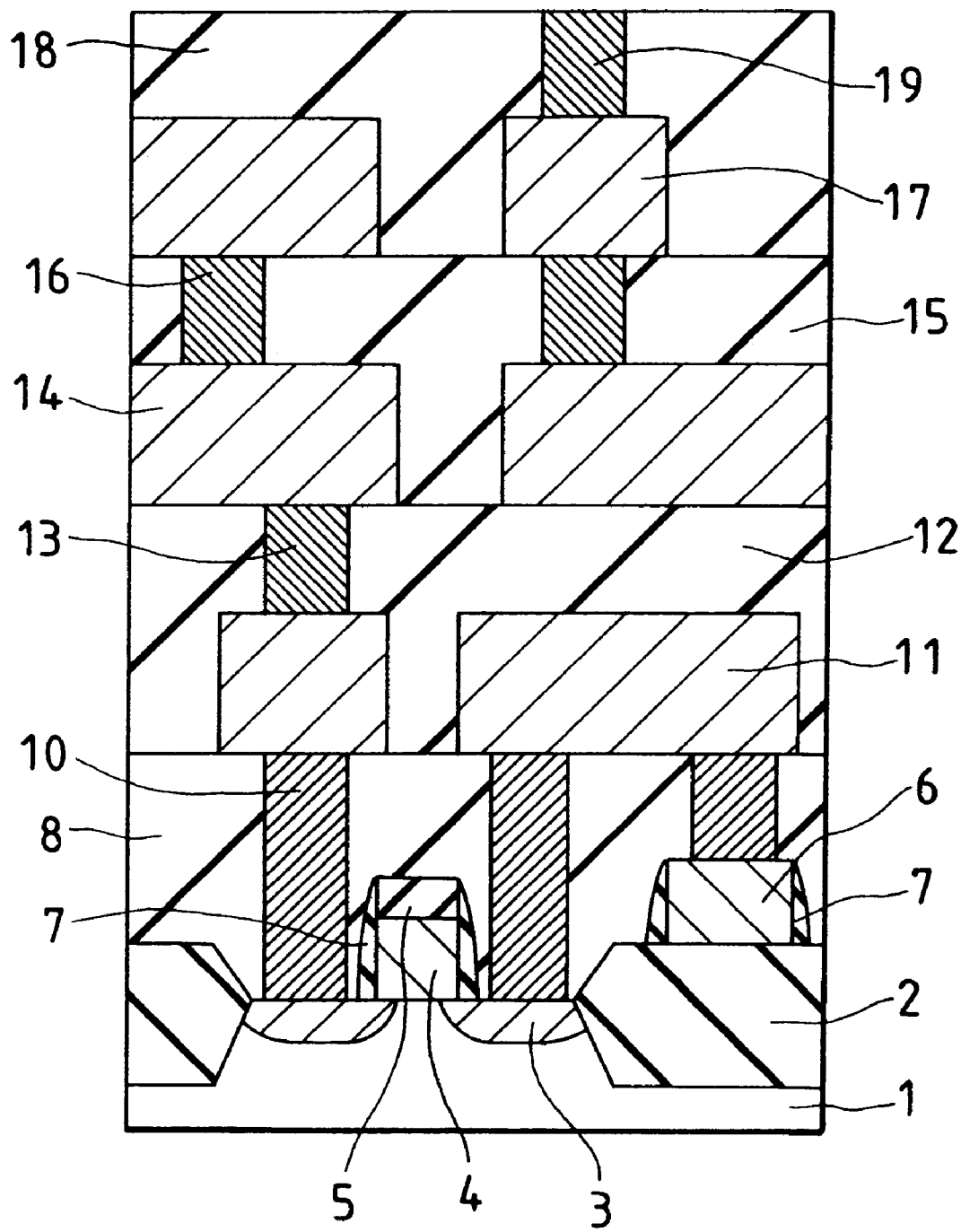
FIG. 18 shows a cross-sectional view of a process for fabricating peripheral circuit portions shown in FIG. 4 according to the embodiment 1 of the invention.

As shown in FIGS. 17 and 18, a second-layer wiring 14 as a conductor is formed in the same is as for the first-layer wiring 11, and thereafter, a third interlayer insulating film 15 (an interlayer insulating film between the second-layer wiring and a third-layer wiring), a third plug 16, a third-layer wiring 17 as a conductor, a fourth interlayer insulating film 18 (an interlayer insulating film between the third-layer wiring and a fourth-layer wiring), and a fourth plug 19 are formed in sequence by the same method as for the second interlayer insulating film 12, second plug 13, and second-layer wiring 14.

A storage capacitor is formed. First, as shown in FIG. 3, after forming a platinum (Pt) film of 100 nm thick as a lower electrode 20 of the capacitor by the well-known sputtering method, it is processed into an electrode shape the size of which is 0.7×0.5 μm. On top of the Pt film are formed in sequence a BST film of 100 nm thick as a capacity insulating layer 21 and a platinum film of 100 nm thick as an upper electrode 22 of the capacitor, and the structure shown in FIG. 3 is formed by processing these films into a predetermined shape.

The storage amount per cell of capacitors formed according to this embodiment is 22 fF (femto-farad), which is sufficient as the storage amount of 256 Mbit DRAM. Since the platinum film used as the upper electrode 22 of the capacitor functions as a wiring layer, the freedom to design wirings has been improved.

Although capacitors are placed above a group of wiring layers, the area of a unit cell of a DRAM memory cell array formed according to this embodiment, as shown in a top view (FIG. 6) of the memory cell array portion, is the same as that of conventional cases where capacitors are placed below a group of wiring layers. This is because the first plug 10, second plug 13, third plug 16, and fourth plug 19 are directly connected mutually without using the intermediary of contact pads for wiring, so that contact pads themselves and the area required for alignment margin between contact pads are eliminated. The effect of improvement in design freedom is also obtained when the method for connecting plugs according to this embodiment is applied to the multilayer wirings of a logic LSI represented by a RISC chip. If the density of plugs between a second-layer wiring and upper-layer wirings is generally higher than that of a first plug, as in a logic LSI, the method for connecting plugs according to the invention can be applied only to portions above a second-layer wiring, that is, a second plug and upper plugs.

Although DRAM capacitors are placed above a group of wiring layers in this embodiment, because difficult processes such as the formation of holes having a large aspect ratio and the padding of such holes are not required, an extreme low number of defects occurred at fabrication, providing no problem for practical use.

Since a capacitor is placed above a group of wiring layers, in addition to the advantage that limitations on microminiaturization by focus margin are relaxed, advantages described below are obtained. Namely, when ferroelectric thin films such as BST films and PZT films are used as capacitor films, one problem is that the property of these ferroelectric thin films deteriorates due to thermal history after capacitor formation. In this embodiment, however, because a capacitor is placed above a group of wiring layers, the capacitor is formed after the wiring layers have been formed, so that degradation of the property of ferroelectric thin films due to the above-mentioned thermal history has been remarkably reduced. Since this advantage is also obtained even when a capacitor of ferroelectric memory is placed above wiring layers, of course, the invention can also apply effectively to this case.

Further, the structure that a capacitor is placed above wiring layers, a DRAM, a ferroelectric memory, an SRAM, and other logic LSIs can be fabricated on identical fabrication lines or be fabricated on an identical chip, so that fabrication processes are standardized and fabrication cost is reduced, and versatile LSIs can be fabricated by combining a variety of circuits.

Figure 19:
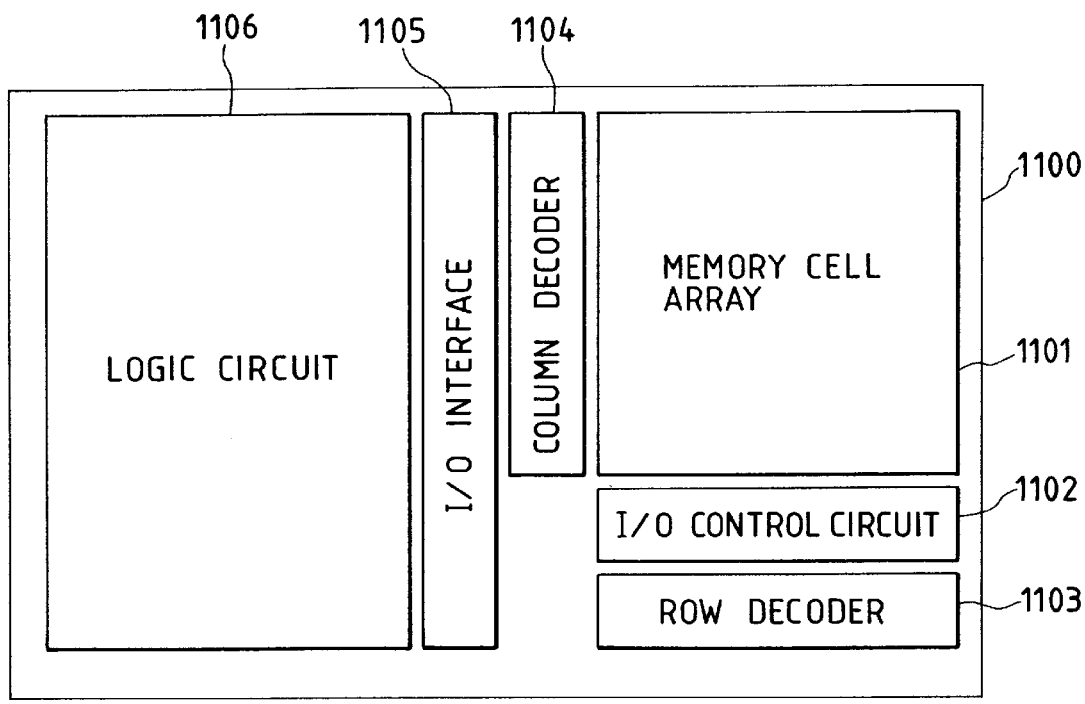
FIG. 19 shows the overall structure of an LSI chip containing DRAM and a logic circuit according to another embodiment of the invention.

As an example of such an LSI chip, FIG. 19 shows a semiconductor integrated circuit device that contains a logic circuit, in addition to a DRAM memory cell array portion and peripheral circuit portions. In the DRAM memory cell array portion, a plurality of plugs for connecting a lower electrode of a capacitor placed above wiring layers and a diffused layer of a MOS transistor are directly connected mutually without using the intermediary of wiring pads and wirings. On the other hand, in the peripheral circuit portions, a plurality of plugs are mutually connected through wiring pads and wirings. Accordingly, microminiaturization required in the memory cell array portion and low connection resistance required in the peripheral circuit portions and the log circuit portion are achieved at the same time. Also, because the plugs penetrating each of a plurality of interlayer insulating films formed in layers are made of an identical metal, the plugs in the memory cell array portion, peripheral circuit portions, and logic circuit portion can be formed through identical processes, offering fewer process steps and reduced cost.

Embodiment 2

This embodiment is a second example that the invention is applied to a DRAM. This embodiment is different from the embodiment 1 described previously, in that the dry etching and CMP processing for interlayer insulating films during formation of connection holes are carried out using etching stopper films and polishing stopper films, respectively. Silicon nitride films are used equally as these etching stopper films and polishing stopper films to simplify processes.

Figure 20:
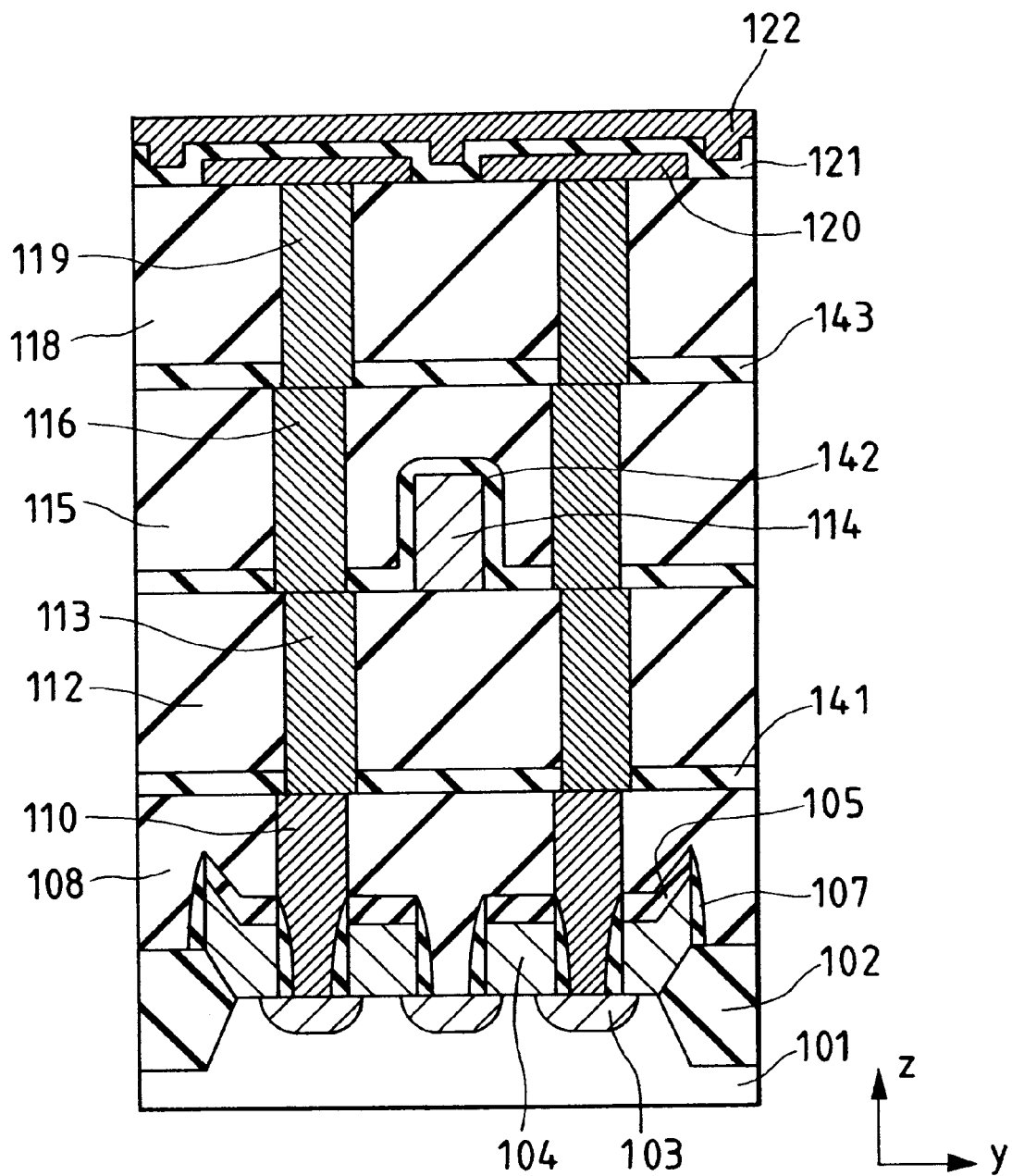
FIG. 20 shows a partial cross-sectional view of a DRAM memory cell array portion according to the embodiment 2 of the invention.
Figure 21:
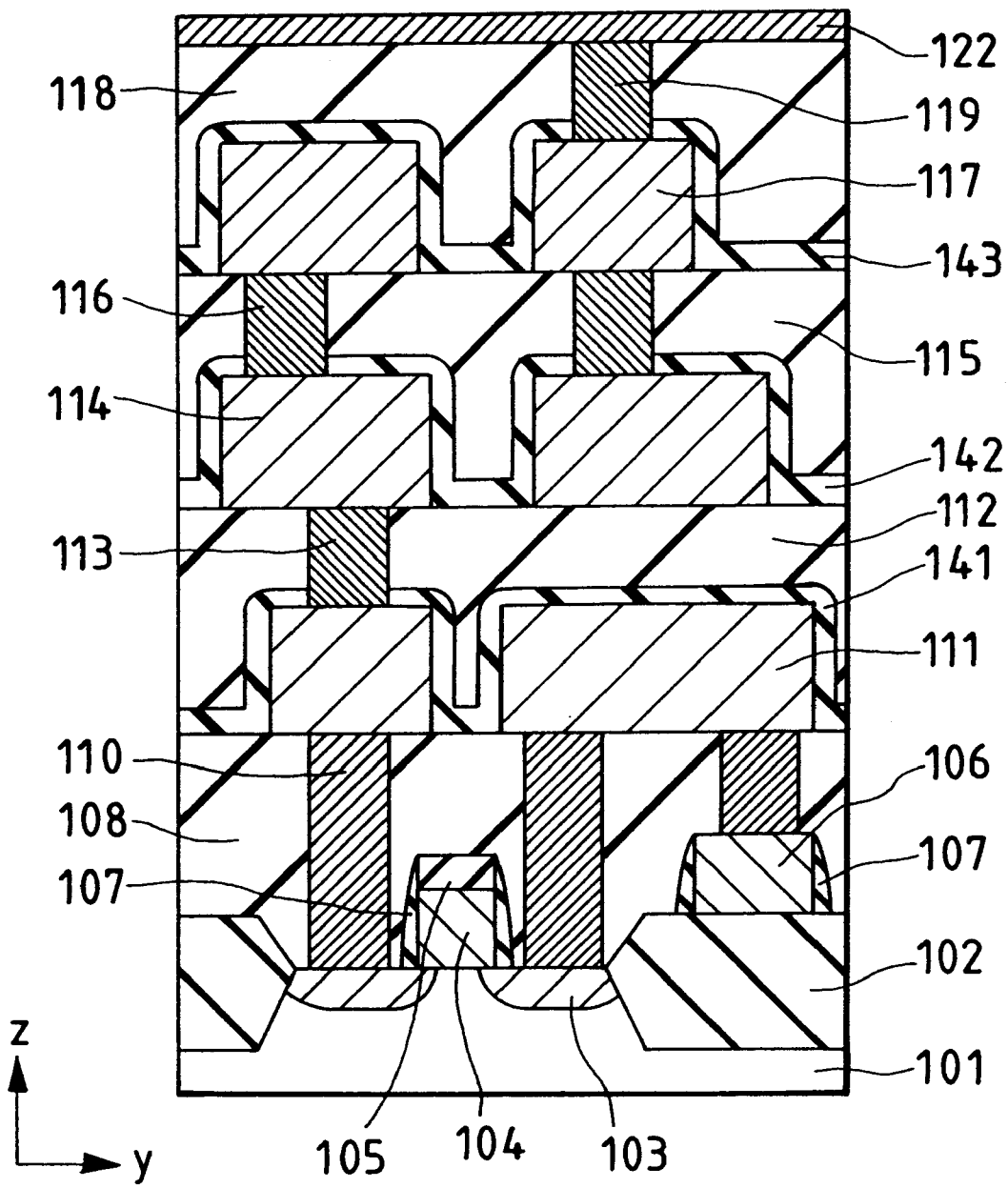
FIG. 21 shows a partial cross-sectional view of DRAM peripheral circuit portions according to an embodiment 2 of the invention.

FIG. 20 shows a partial cross-sectional view of a DRAM memory cell array portion formed in the embodiment 2 of the invention. FIG. 21 shows a partial cross-sectional view of DRAM peripheral circuit portions formed in the embodiment 2 of the invention. FIGS. 22 to 31 are process cross-sectional views showing a method for fabricating the DRAM. FIGS. 22, 24, 26, 28, and 30 are cross-sectional views showing fabricating processes for the memory cell array portion shown in FIG. 20, and FIGS. 23, 25, 27, 29, and 31 are cross-sectional views showing fabricating processes for the peripheral circuit portions shown in FIG. 21.

Figure 22:
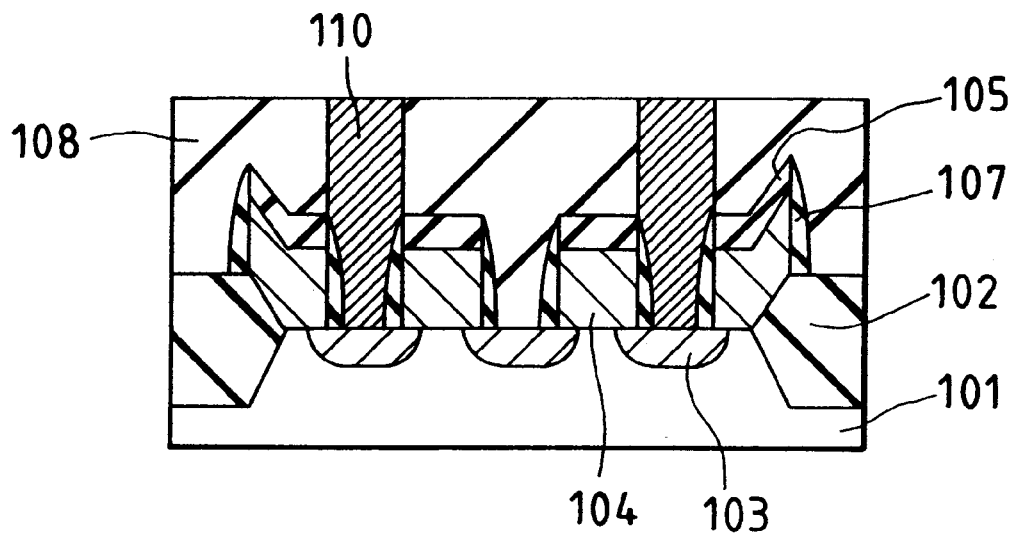
FIG. 22 shows a cross-sectional view of a process for fabricating a memory cell array portion according to the embodiment 2 of the invention.
Figure 23:
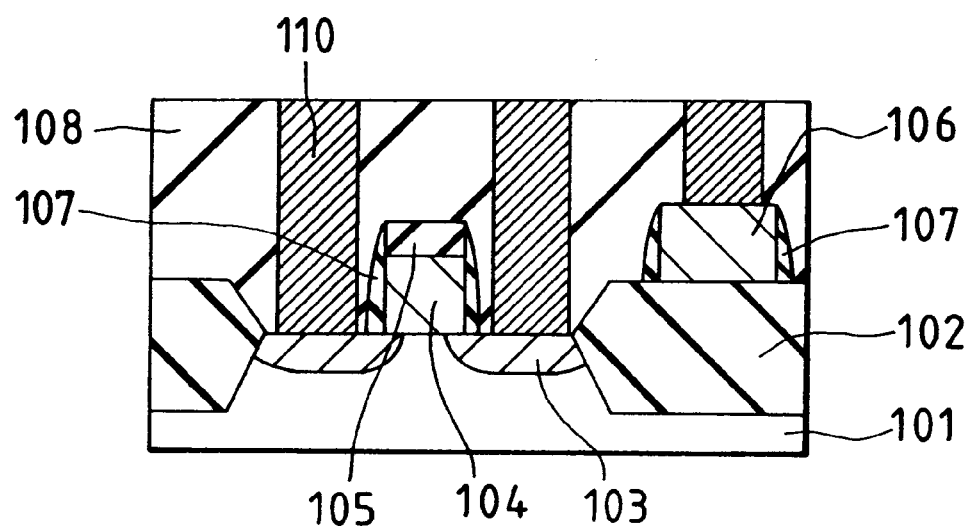
FIG. 23 shows a cross-sectional view of a process for fabricating peripheral circuit portions according to the embodiment 2 of the invention.

First, as shown in FIGS. 22 and 23, in the same way as in the embodiment 1 described above, on a silicon substrate 101 are formed in sequence a silicon oxide film 102 for element isolation, a diffused layer 103 having a conduction type reverse to that of the silicon film 101, a gate electrode 104, a multilayer film 105 of a silicon oxide film and a silicon nitride film, a side wall spacer 107 of the gate electrode, a BPSC film 108 as a first interlayer insulating film, and a first plug 110.

Figure 24:
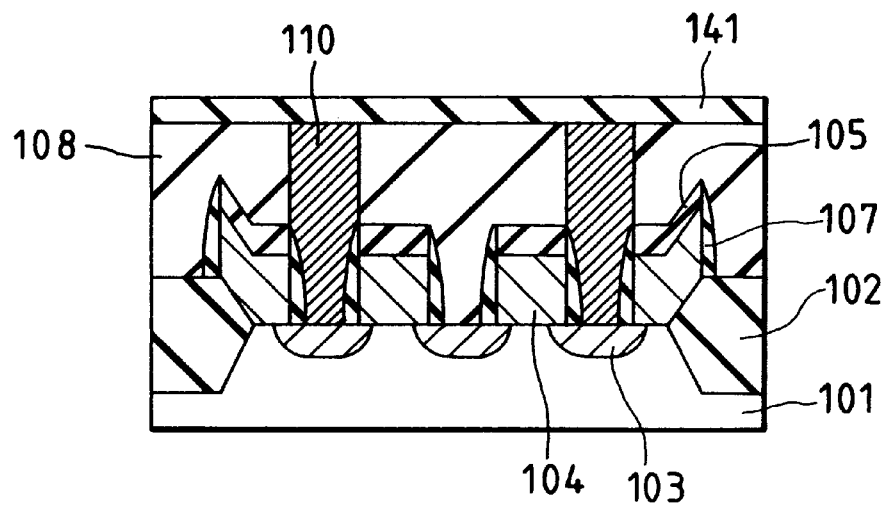
FIG. 24 shows a cross-sectional view of a process for fabricating a memory cell array portion according to the embodiment 2 of the invention.
Figure 25:
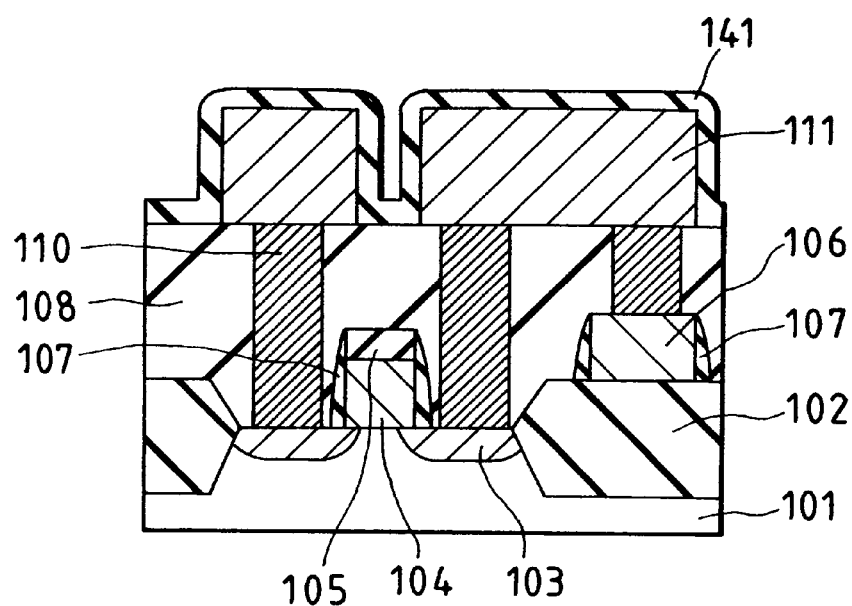
FIG. 25 shows a cross-sectional view of a process for fabricating peripheral circuit portions according to the embodiment 2 of the invention.

Next, as shown in FIGS. 24 and 25, after forming a first-layer wiring 111 having a predetermined shape that consists of a multilayer film of three layers, a tungsten film, an aluminum film, and a titanium nitride film by using a known method, a silicon nitride film 141 of 75 nm thick is formed. The silicon nitride films 141 is used for the polishing of a second interlayer insulating film 112 and as an etching stopper film in the etching to form a connection hole for a second plug 113, respectively, that are performed in subsequent processes.

Figure 26:
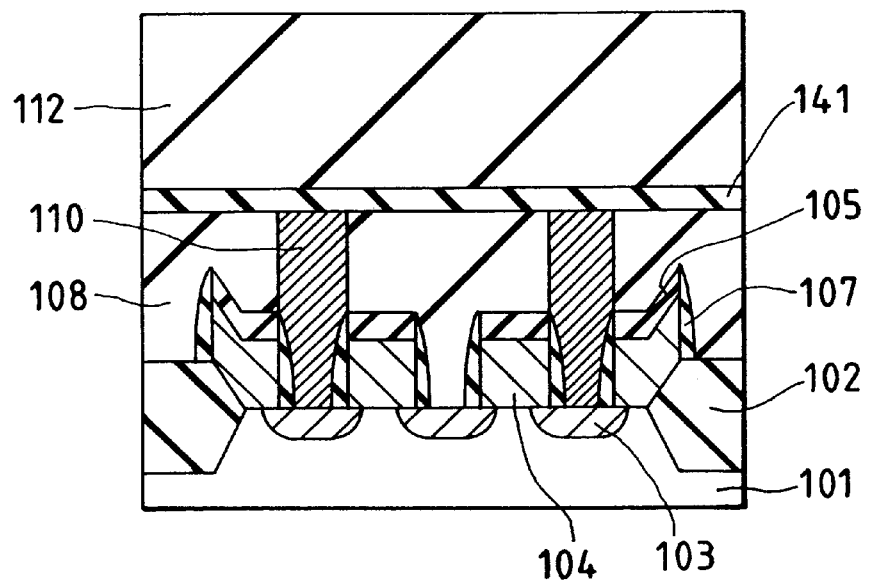
FIG. 26 shows a cross-sectional view of a process for fabricating a memory cell array portion according to the embodiment 2 of the invention.
Figure 27:
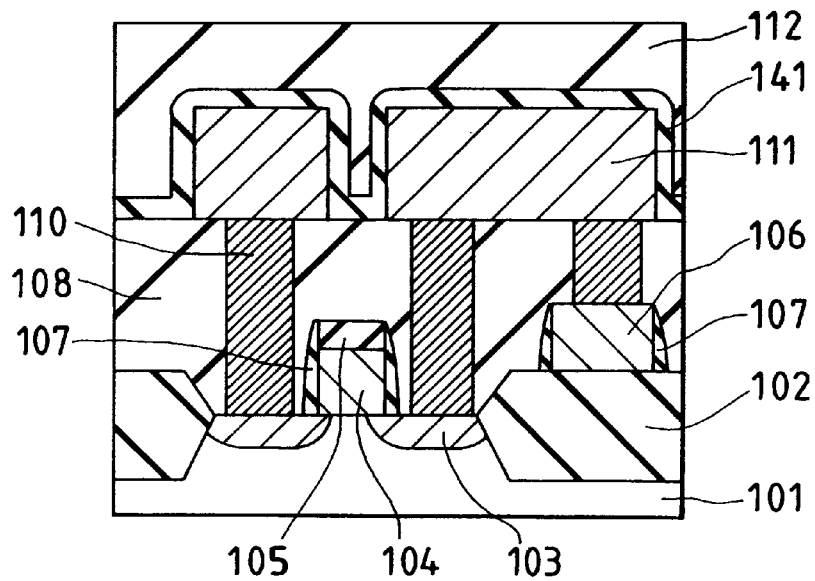
FIG. 27 shows a cross-sectional view of a process for fabricating peripheral circuit portions according to the embodiment 2 of the invention.

As shown in FIGS. 26 and 27, after forming a silicon oxide film of 600 nm thick by the high density plasma CVD method, it is polished by the CMP method to flatten the surface. The silicon nitride film 141 functioned as a stopper film for polishing, and the silicon oxide film above the first-layer wiring 111 is completely removed by polishing, leaving the silicon oxide film only in portions in which the first-layer wiring 111 is not formed. Then, a silicon oxide film of 200 nm thick is formed by the well-known plasma CVD method that uses TEOS (tetraethyl orthosilicate) gases as raw materials, and a second interlayer insulating film 112 is formed.

Figure 28:
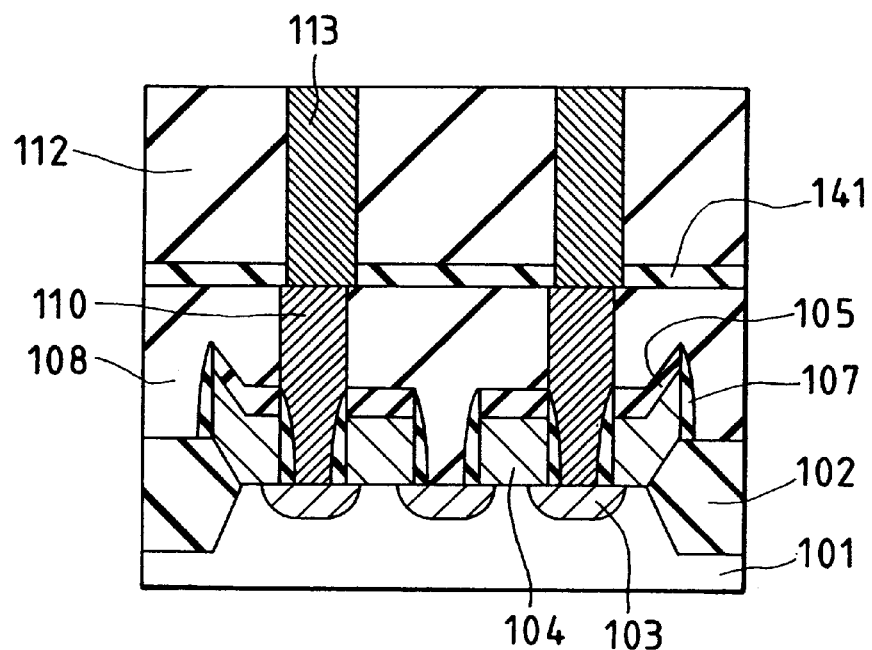
FIG. 28 shows a cross-sectional view of a process for fabricating a memory cell array portion according to the embodiment 2 of the invention.
Figure 29:
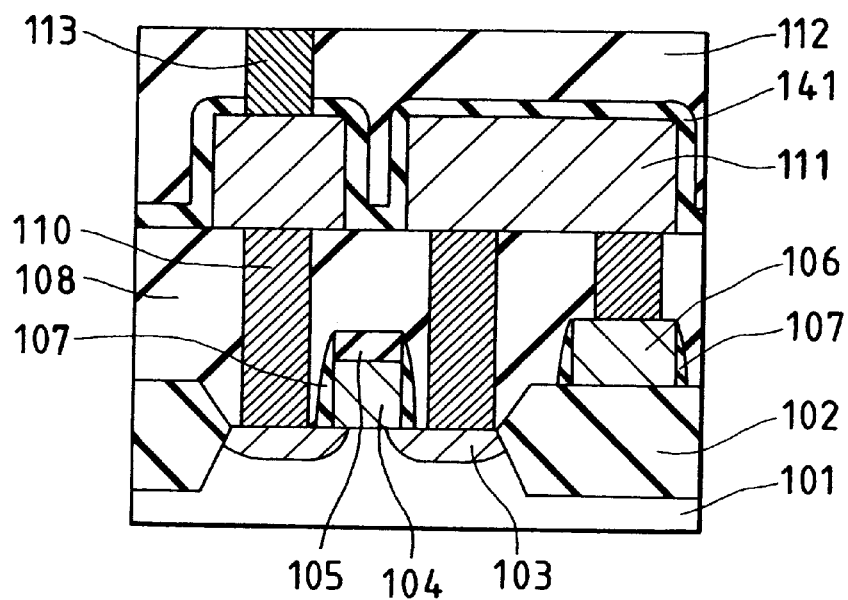
FIG. 29 shows a cross-sectional view of a process for fabricating peripheral circuit portions according to the embodiment 2 of the invention.

As shown in FIGS. 28 and 29, after etching a predetermined portion of the second interlayer insulating film 112 (silicon oxide film), a connection hole is formed by removing an exposed silicon nitride film 141. When a predetermined portion of the second interlayer insulating film 112 (silicon oxide film) is etched, the silicon nitride film 141 functioned as an etching stopper and is effective in preventing the first-layer wiring 111 from being etched. In the previous embodiment 1, because an etching stopper film is not used, a wiring layer 11 is overetched when a connection hole is formed, and etching conditions are severe, while, in this embodiment, because the silicon nitride film 141 functions as an etching stopper film, etching conditions are significantly relaxed.

By padding a connection hole formed in this way with a tungsten film by the selective CVD method, a second plug 113 is formed.

Figure 30:
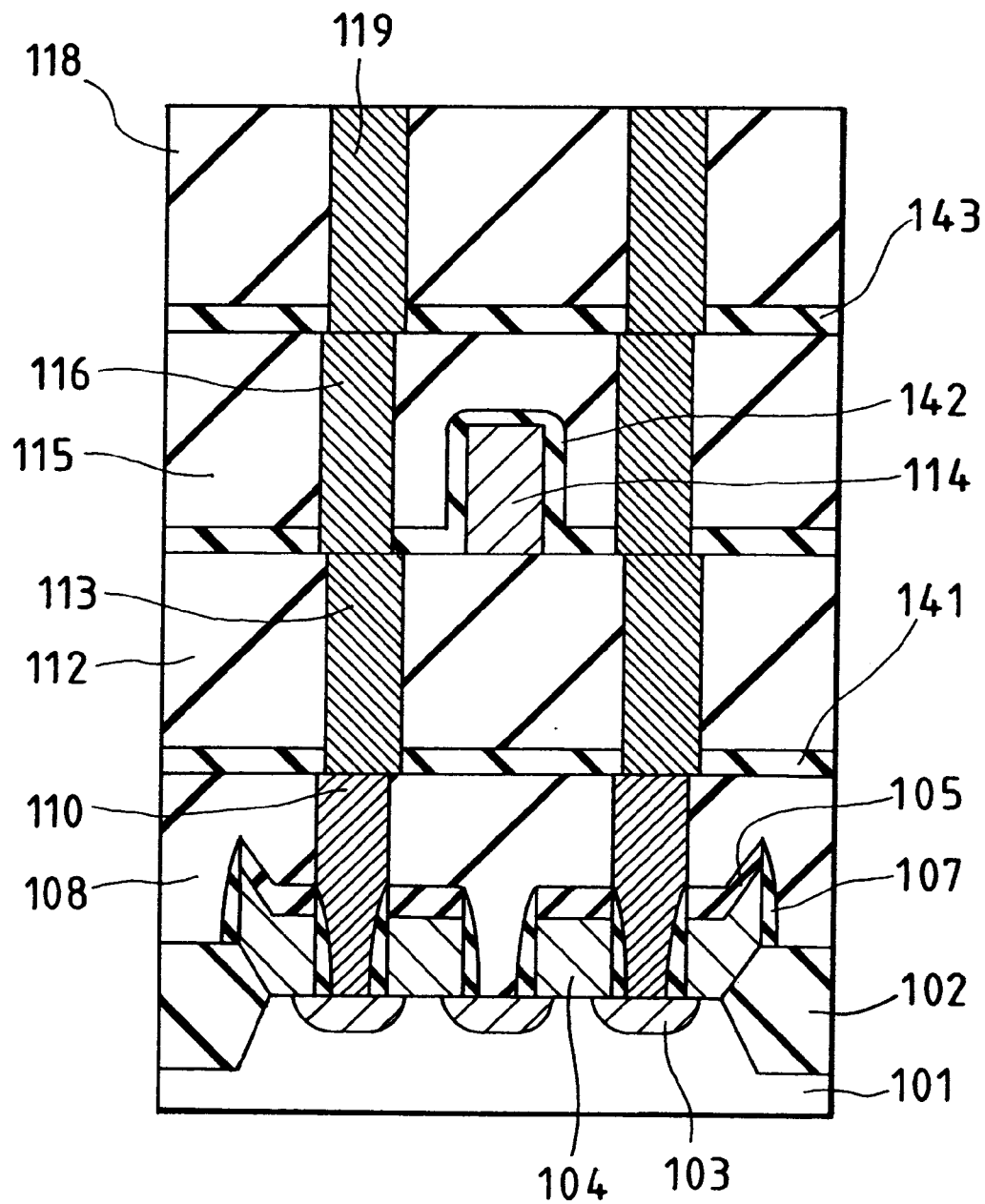
FIG. 30 shows a cross-sectional view of a process for fabricating a memory cell array portion according to the embodiment 2 of the invention.
Figure 31:
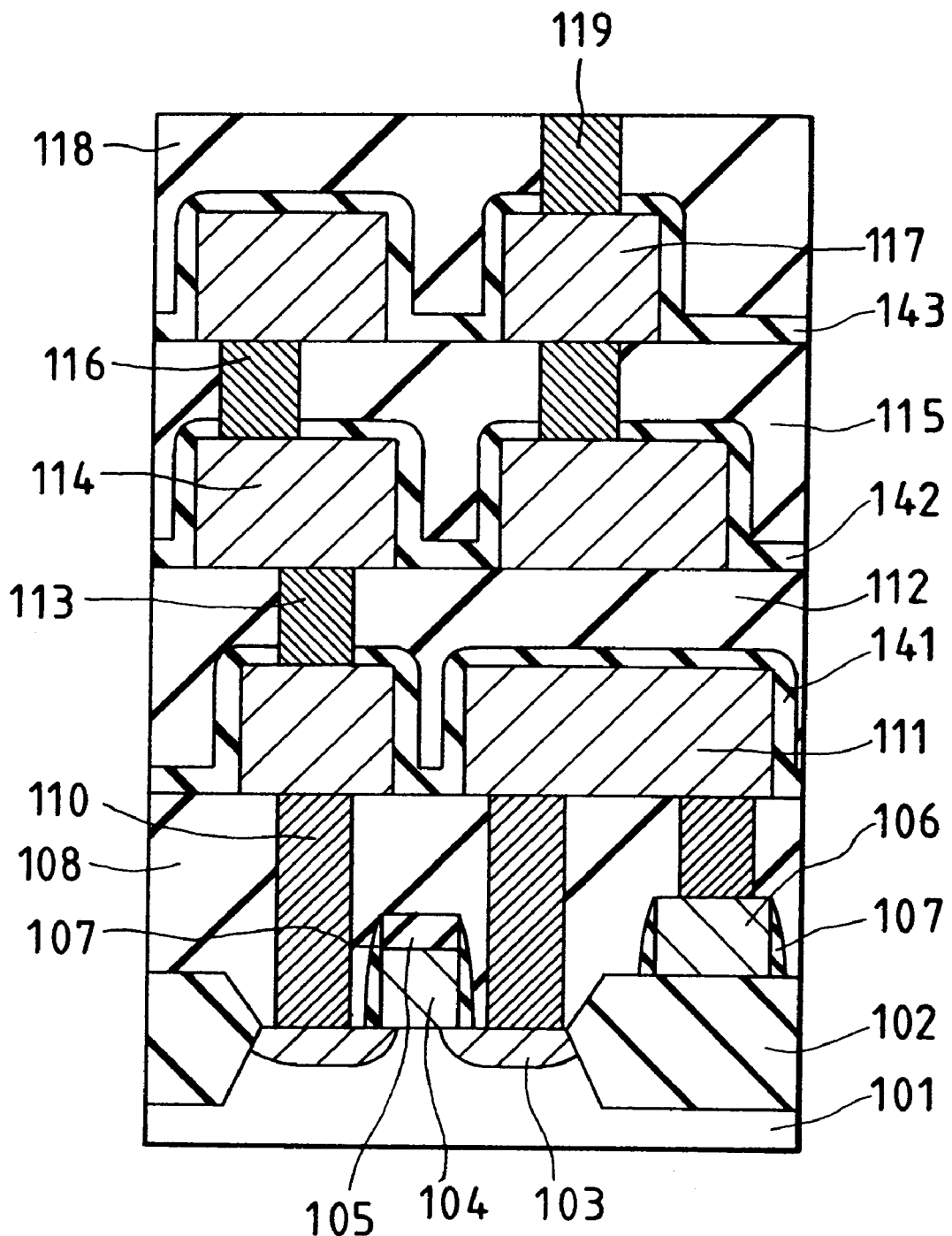
FIG. 31 shows a cross-sectional view of a process for fabricating peripheral circuit portions according to the embodiment 2 of the invention.

A second-layer wiring 114, a third interlayer insulating film 115, a third plug 116, a third-layer wiring 117, a fourth interlayer insulating film 118, and a fourth plug 119 are formed in sequence using the same method as for the second interlayer insulating film 112, first plug 113, and first-layer wiring 111 and the structures shown in FIGS. 30 and 31 are formed, then in the same way as in the embodiment 1, a storage capacitor consisting of a lower electrode 120 of a capacitor, a capacity insulating film 121, and an upper electrode 122 of the capacitor is formed and the structures shown in FIGS. 20 and 21 are formed.

According to this embodiment, because a CMP stopper film and an etching stopper film are used, interlayer insulating films are flattened, the margin of dry etching in the formation of connection holes is enlarged, and control of both processes is improved. Also, because a second interlayer insulating film 112 is thinner than that in the embodiment 1, the aspect ratio of connection holes becomes small, the formation of connection holes and the padding of the connection holes are facilitated, and the connection holes can be padded using the sputtering method and the CVD method, as well as the selective CVD method.

Embodiment 3

This embodiment is a third example that the invention is applied to the formation of a DRAM.

Figure 36:
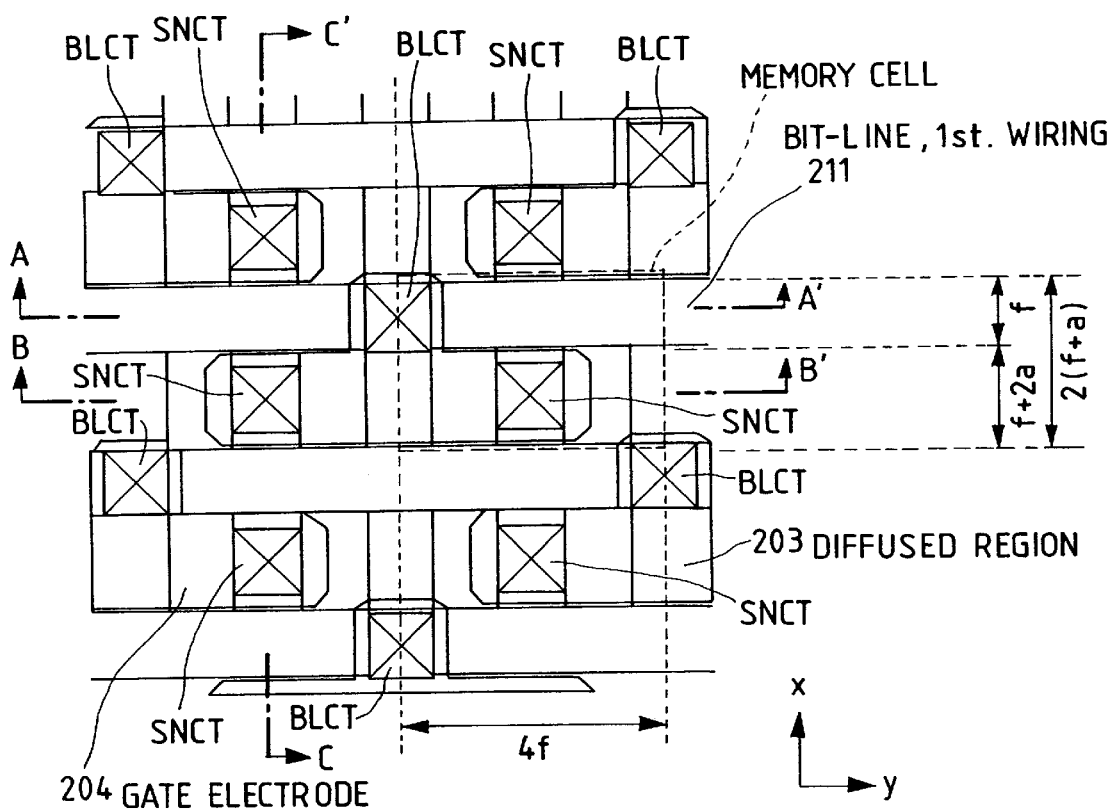
FIG. 36 shows a top view of a DRAM memory cell array portion according to the embodiment 3 of the invention.
Figure 37:
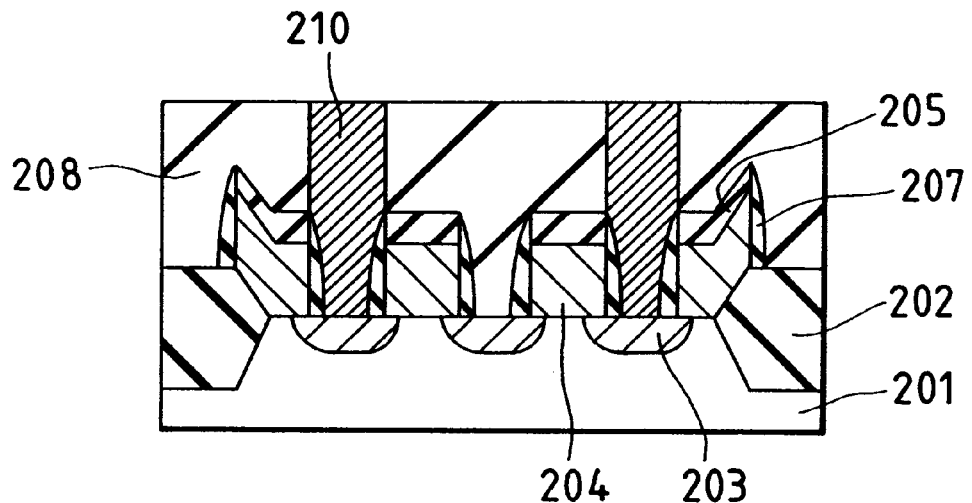
FIG. 37 shows a cross-sectional view of a process for fabricating a memory cell array portion shown in FIG. 32 according to the embodiment 3 of the invention.
Figure 38:
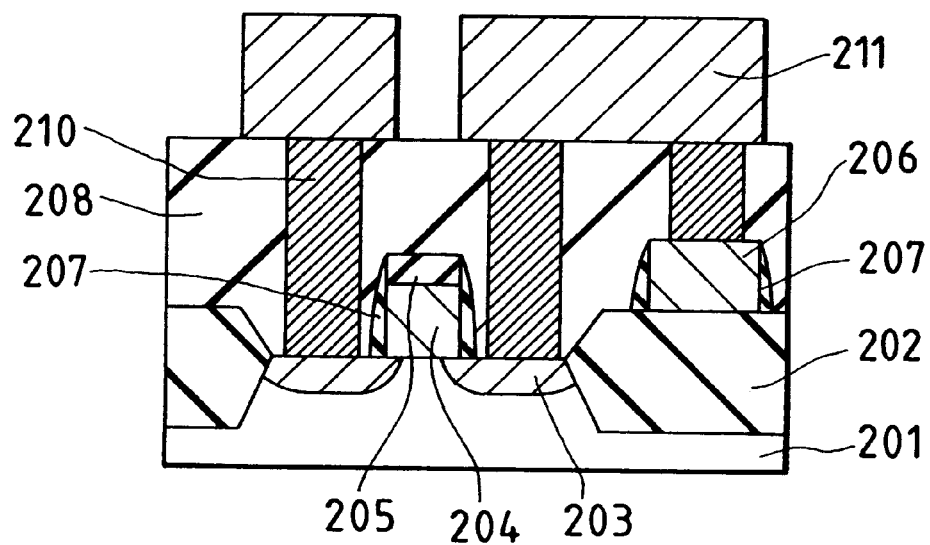
FIG. 38 shows a cross-sectional view of a process for fabricating peripheral circuit portions shown in FIG. 33 according to the embodiment 3 of the invention.
Figure 50:
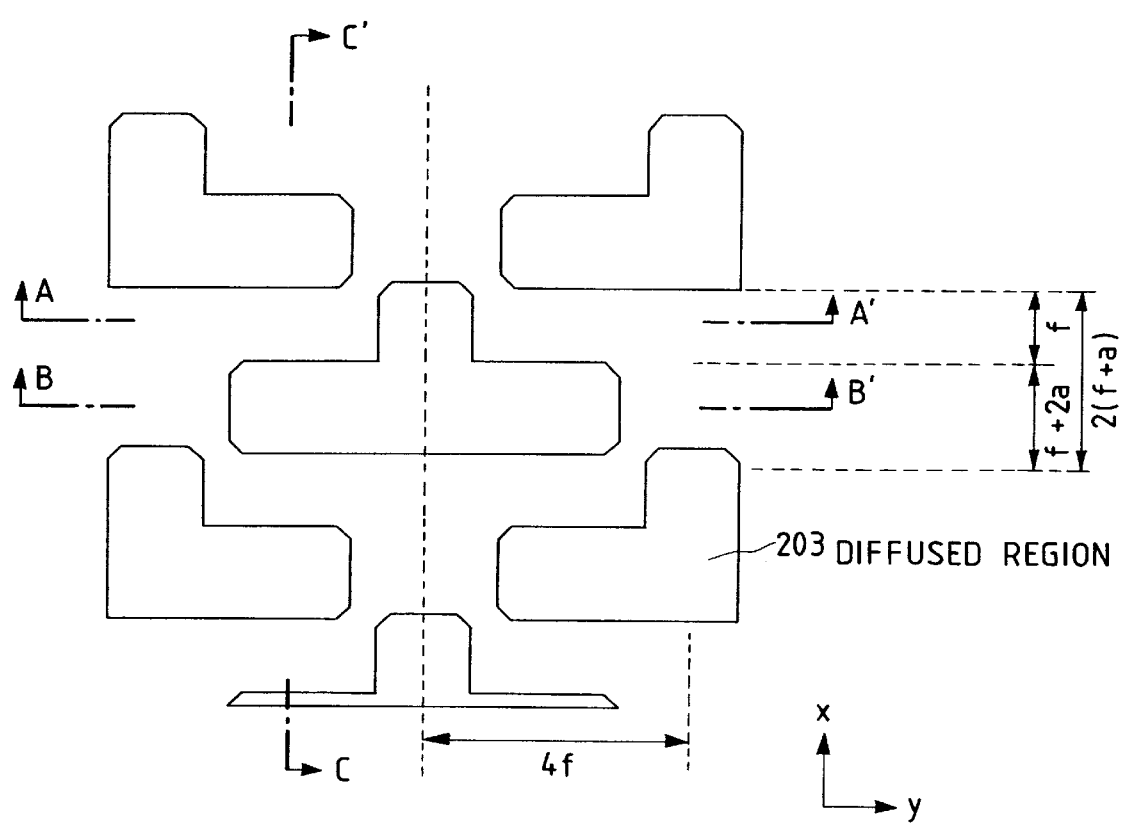
FIG. 50 is an exploded view showing the placement relationship of diffused layers 203 in FIG. 36.
Figure 51:
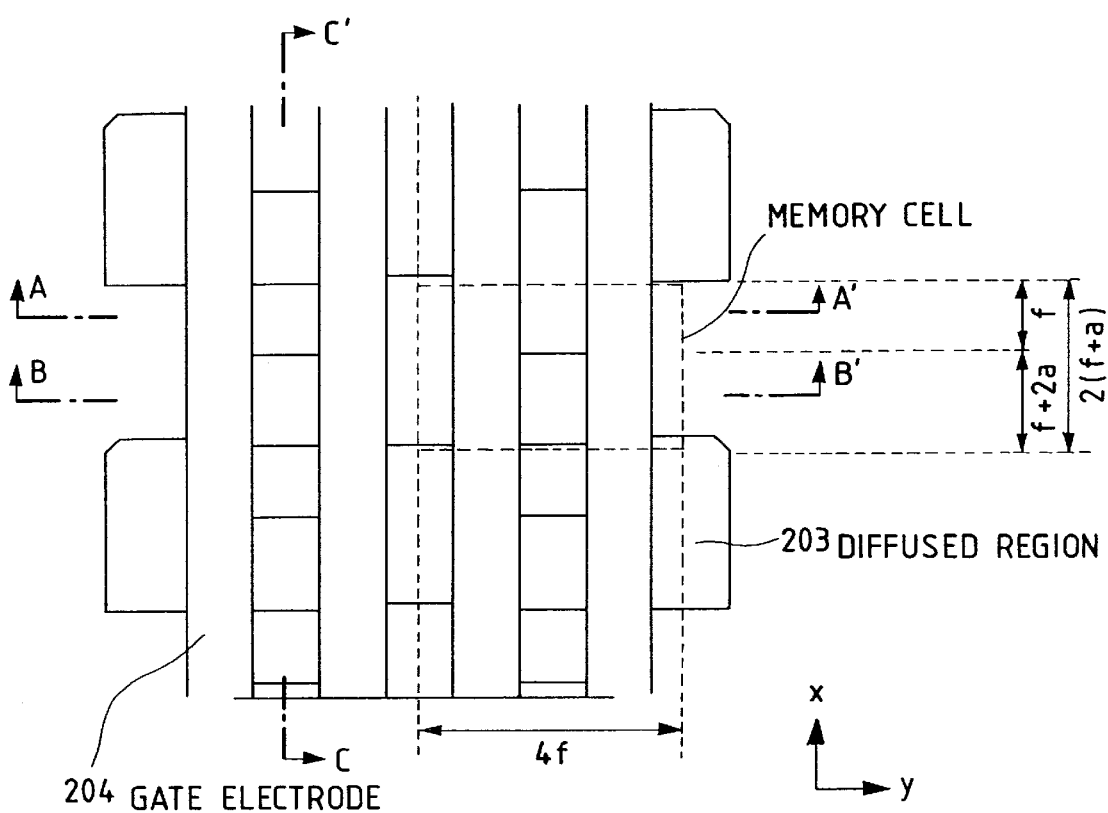
FIG. 51 is an exploded view showing the placement relationship of gate electrodes 204 in FIG. 36.
Figure 52:
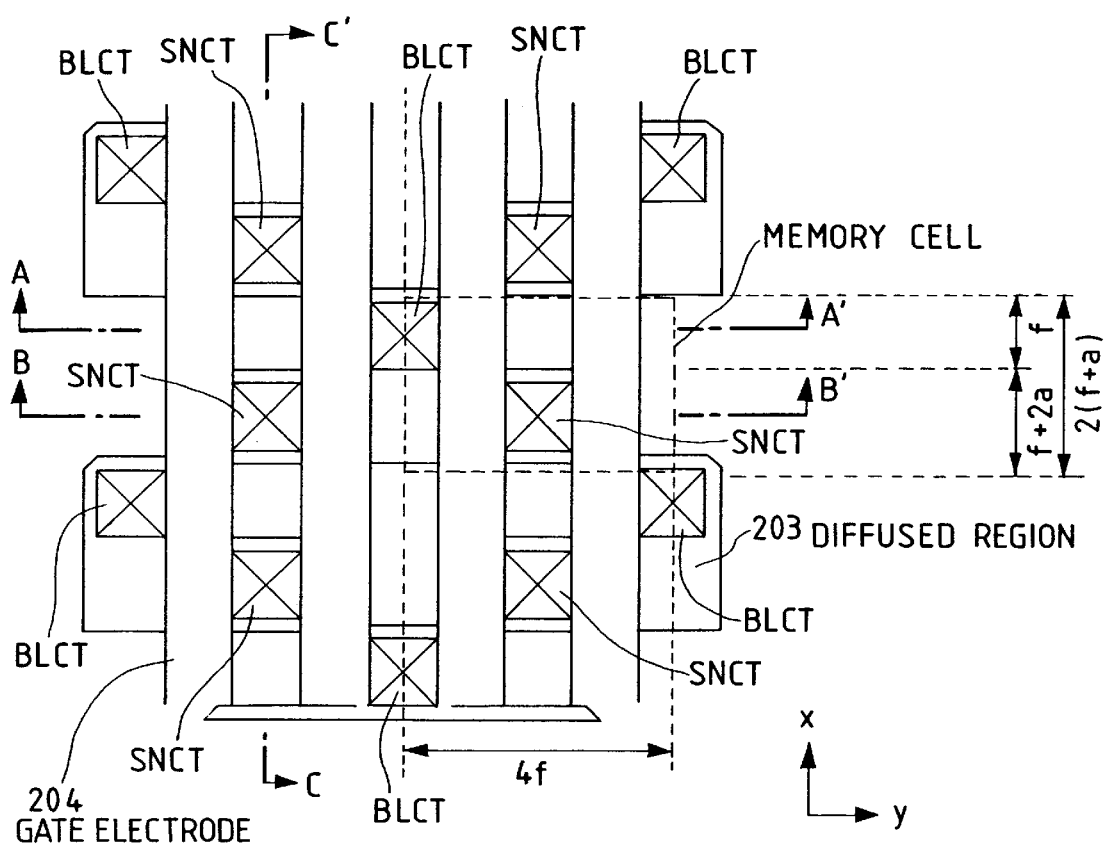
FIG. 52 is an exploded view showing the placement relationship of SNCTs (storage node contacts) and BLCTs (bit line contacts) in FIG. 36.
Figure 53:
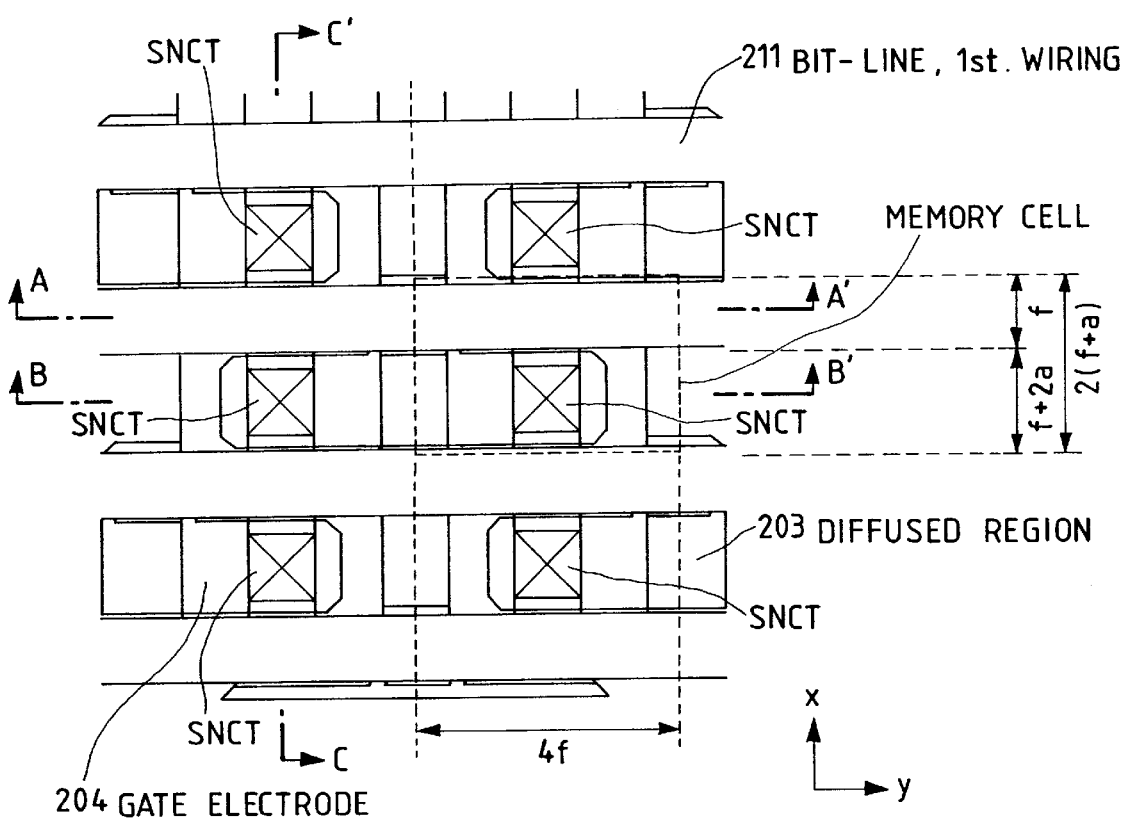
FIG. 53 is an exploded view showing the placement relationship of a bit line (first layer wiring) 211 in FIG. 36.

FIGS. 32 to 35 are cross-sectional views of major portions of a DRAM according to this embodiment. FIGS. 37 to 42 show the processes for fabricating the major portions. FIGS. 37 to 42 show fabricating processes. FIGS. 37, 39, 40, and 42 are process cross-sectional views showing the fabricating processes for a DRAM memory cell array portion according to this embodiment, and FIGS. 38 and 41 are process cross-sectional views showing the fabricating processes for peripheral circuit portions. FIG. 36 is a top view of a DRAM memory cell array portion according to this embodiment, and shows a plane placement of the memory cell array portion at the time when up to a first-layer wiring 211 is formed by the fabricating processes for the memory cell array portion shown in FIGS. 32, 34, and 35. FIGS. 50 to 53 show the placement relationship of each of layers in FIG. 36. Namely, FIG. 50 shows the placement relationship of a diffused layer 203 in FIG. 36, FIG. 51 shows the placement relationship of a gate electrode 204 in FIG. 36, FIG. 52 shows the placement relationship of SNTCs (storage node contacts) and BLTCs (bit line contacts) in FIG. 36, and FIG. 49 shows the placement relationship of a bit line (first-layer wiring) 211 in FIG. 36.

This embodiment is characterized in that, as shown in FIGS. 32 to 35, by forming wiring side wall spacers 241 consisting of a silicon nitride film on the sides of a first-layer wiring (bit line) 211, the first-layer wiring 211 and a plug 213 are mutually insulation separated to reduce the distance between them. Accordingly, as shown in FIG. 36, the size of a unit memory cell is 4×f in the y direction, which is the same as in the embodiment 1, while it is reduced to 2×(f+a) in the x direction (f is critical dimension and a is alignment margin, and in this embodiment, f is 0.2 μm and a is 0.04 μm). In this embodiment, to realize the structure of a cell whose area is microscopic, the sides of connection plugs are not slanted and are almost vertical to the bottom, and the dimensions of the top and bottom are made equal to each other.

Figure 32:
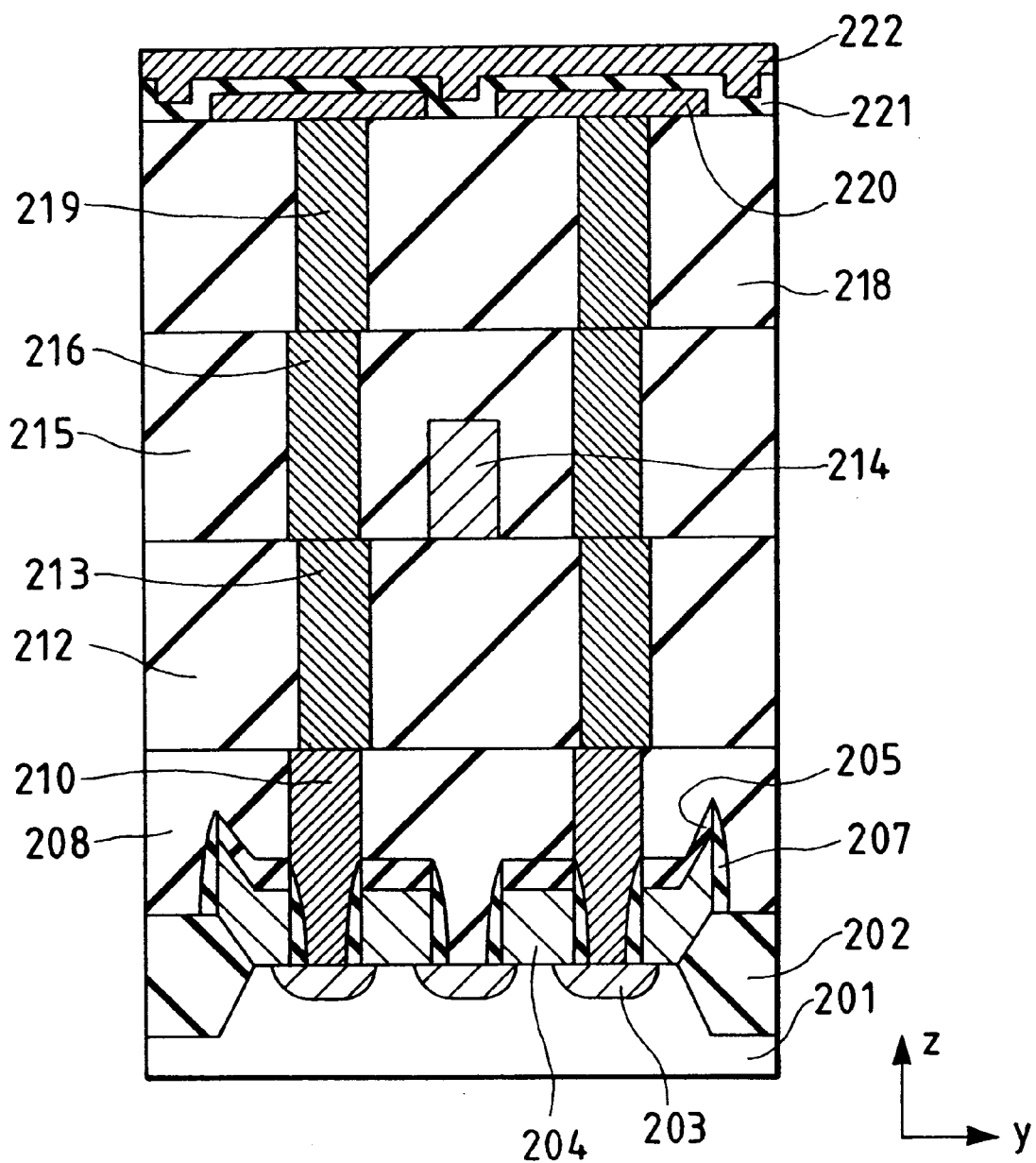
FIG. 32 shows a cross-sectional view taken in B–B' line of a memory cell array portion shown in FIG. 36 according to an embodiment 3 of the invention.
Figure 33:
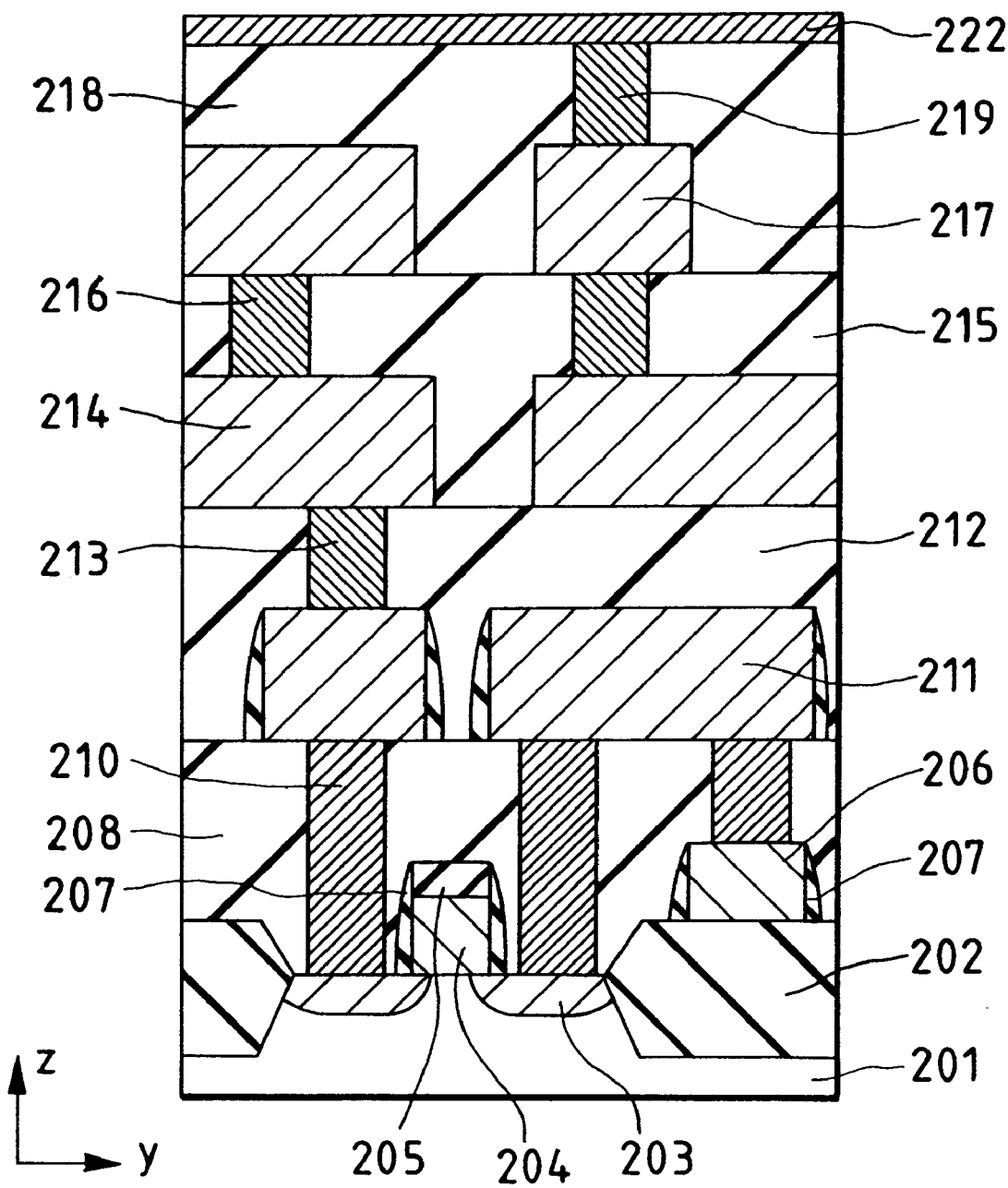
FIG. 33 shows a cross-sectional view of DRAM peripheral circuit portions according to the embodiment 3 according to the invention.
Figure 34:
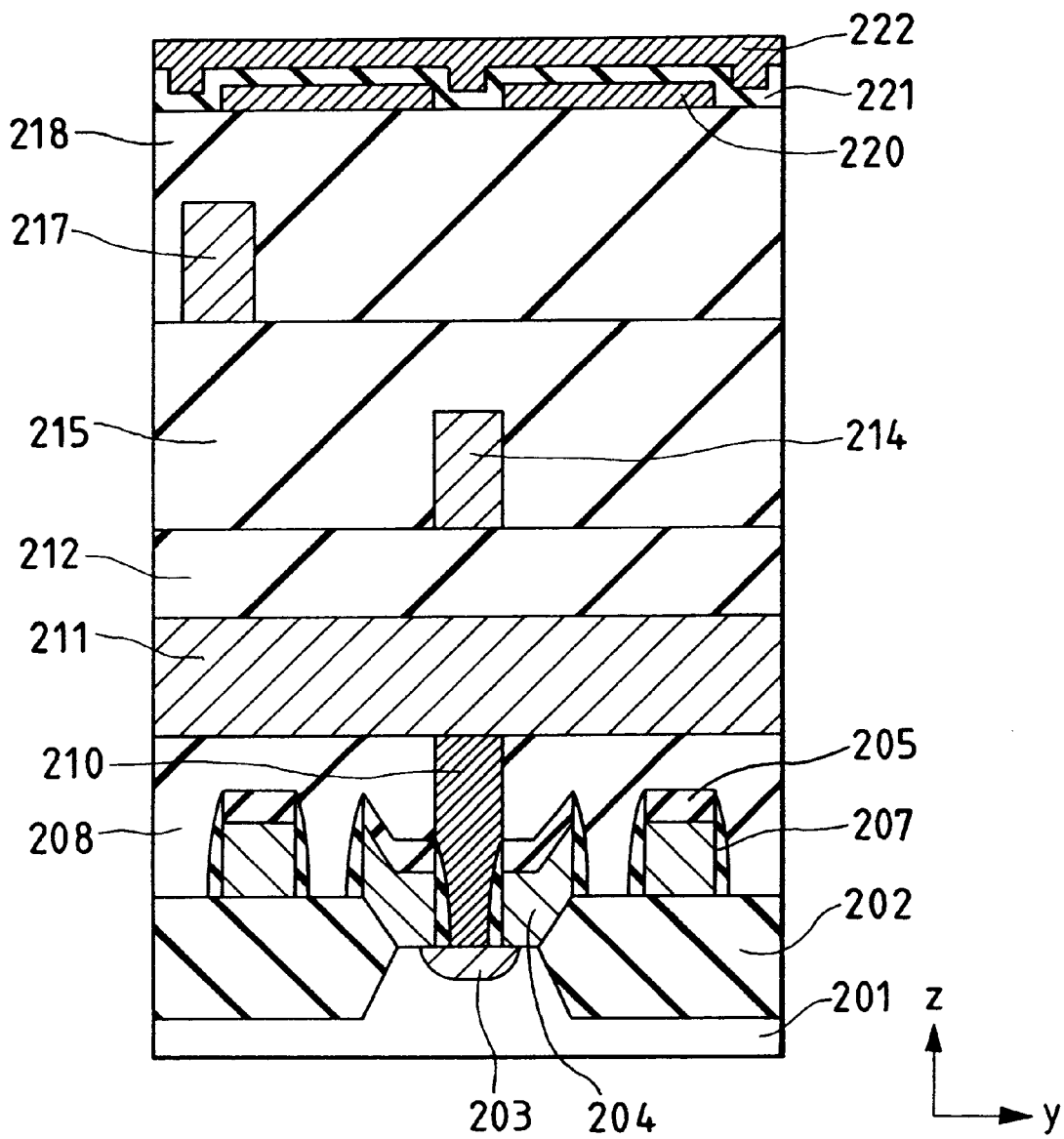
FIG. 34 shows a cross-sectional view taken in A–A' line of a memory cell array portion shown in FIG. 36 according to the embodiment 3 of the invention.
Figure 35:
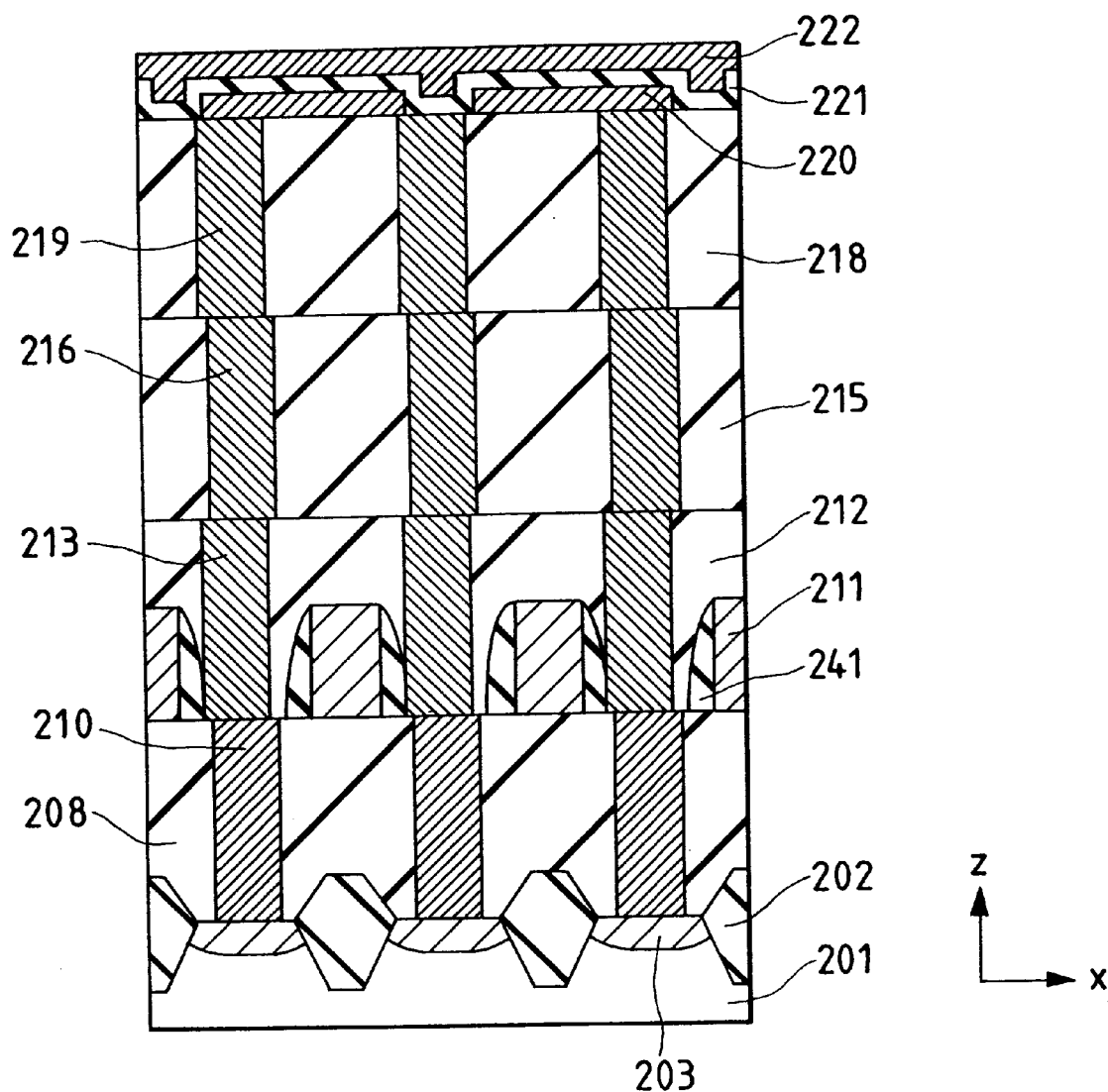
FIG. 35 shows a cross-sectional view taken in C–C' line of a memory cell array portion shown in FIG. 36 according to the embodiment 3 of the invention.

FIG. 36 is a mask pattern showing the plane placement of layers on which plugs in a memory cell array portion are formed. The cross-sectional structure of the memory cell array portion shown in FIG. 34 is the one along an A–A' line in FIG. 36, and the cross-sectional structure of the memory cell array portion shown in FIG. 32 is the one along a B–B' line in FIG. 6.

Figure 39:
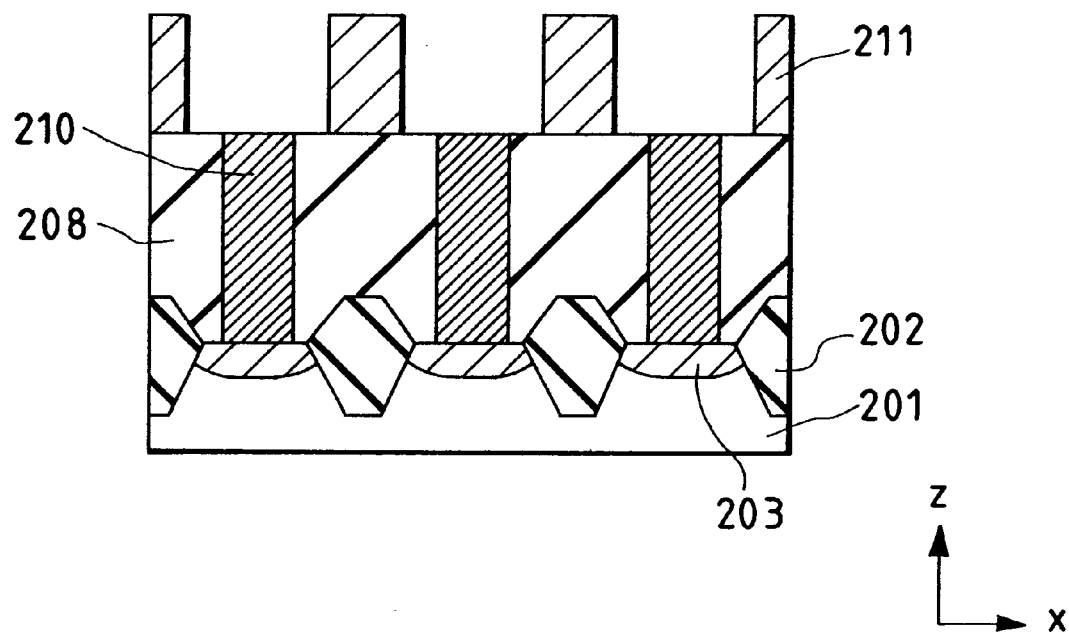
FIG. 39 shows a cross-sectional view of a process for fabricating a memory cell array portion shown in FIG. 35 according to the embodiment 3 of the invention.

The method for fabricating a DRAM according to this embodiment will be described with reference to FIGS. 37 to 42. In the same way as in the previous embodiment 1, on a silicon substrate 201 are formed a silicon oxide film 202 for element isolation, a diffused layer 203, a gate electrode 204, a first interlayer insulating film 208, a first plug 210, and a first-layer wiring 211 and the structures shown in FIGS. 37 to 39 are obtained.

Figure 40:
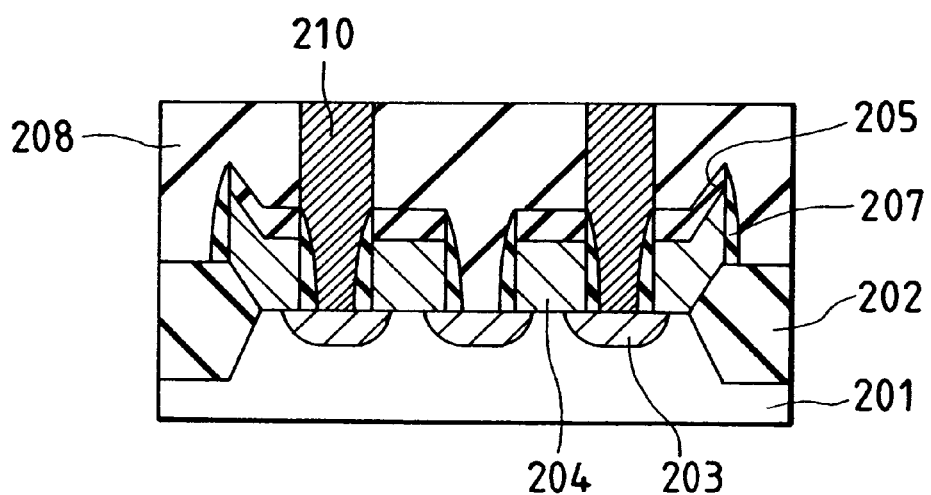
FIG. 40 shows a cross-sectional view of a process for fabricating a memory cell array portion shown in FIG. 32 according to the embodiment 3 of the invention.
Figure 41:
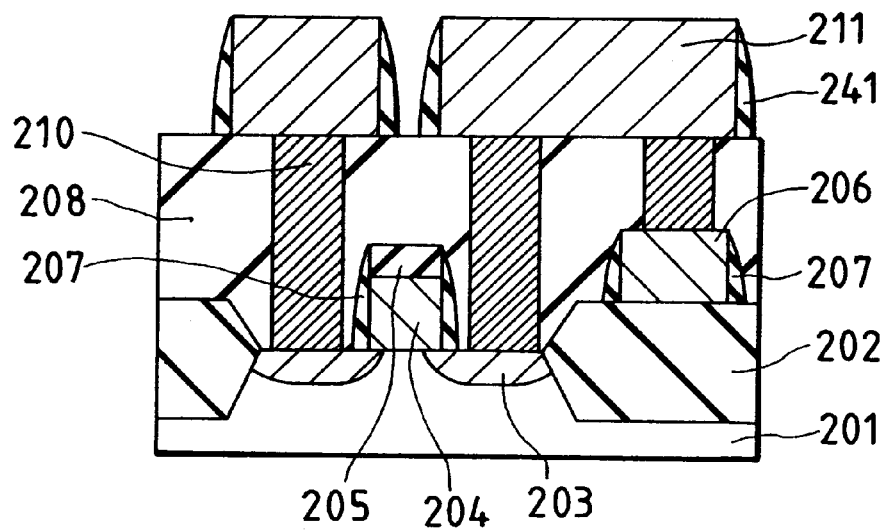
FIG. 41 shows a cross-sectional view of a process for fabricating peripheral circuit portions shown in FIG. 33 according to the embodiment 3 of the invention.
Figure 42:
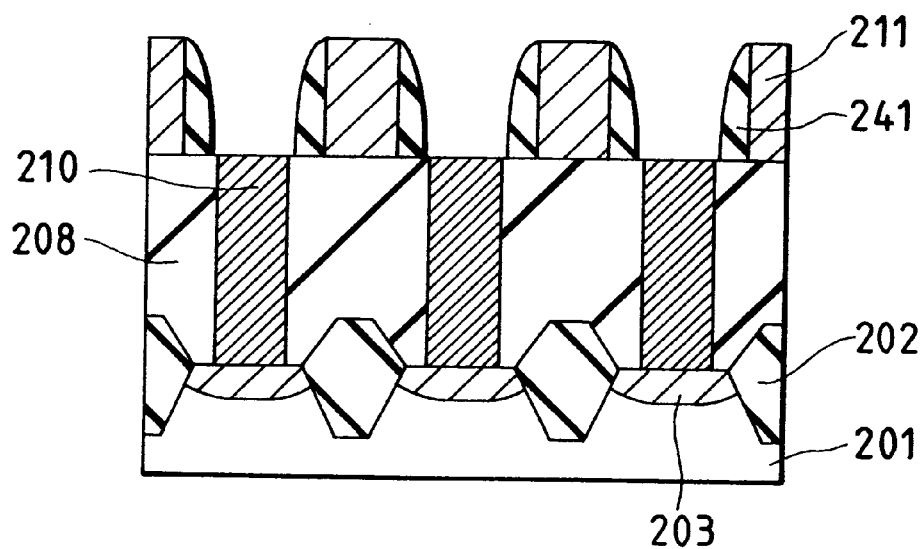
FIG. 42 shows a cross-sectional view of a process for fabricating a memory cell array portion shown in FIG. 35 according to the embodiment 3 of the invention.

Next, after forming a silicon nitride film of 50 nm thick on the whole surface, anisotropic etching is performed, and wiring side wall spacers 241 consisting of a silicon nitride film are formed on the sides of the first-layer wiring 211 as shown in FIGS. 40 to 42, by leaving portions formed on the side walls of the first-layer wiring 211 of the silicon nitride film and removing all other portions.

Thereafter, after forming a second interlayer insulating film 212 in the same is as in the above-mentioned embodiment 1, a second plug 213 consisting of a tungsten film is formed using the selective CVD method and the CMP method, and further a second-layer wiring 214, a third interlayer insulating film 215, a third plug 216, a third-layer wiring 217, a fourth interlayer insulating film 218, a fourth plug 219, and a capacitor consisting of a lower electrode 220 of the capacitor, a capacity insulating film 221, and an upper electrode 222 of the capacitor are formed in sequence and the structures shown in FIGS. 32 to 35 are obtained.

As apparent from FIGS. 32 to 35, in this embodiment, because the second plug 213 and the first-layer wiring 211 are mutually insulation separated by a wiring wall side spacer 241 consisting of a silicon nitride film, the distance between both can be reduced and a extremely microscopic cell structure is obtained.

As apparent from the above description, according to the invention, because the microminiaturization of multilayer wirings and the freedom to design them have been improved, a time required for the design of semiconductor integrated circuits has been significantly reduced. Also, because a semiconductor integrated circuit device which is of such a structure that a storage capacitor is placed above wiring layers can be fabricated without forming holes having a large aspect ratio and padding such holes having a large aspect ratio with a metal film, factors that cause fabrication defects have been remarkably eliminated and the cost of the design and fabrication of semiconductor integrated circuit devices has been significantly reduced.

What is claimed is:

1. A method for fabricating a semiconductor integrated circuit device, which at least includes a memory cell array part and a peripheral circuit part, comprising the steps of:

forming a first interlayer insulating film on a semiconductor substrate;

removing selectively a predetermined portion of said first interlayer insulating film and forming a first connection hole the sides of which are substantially vertical to the bottom thereof, the first connection hole penetrating said first interlayer insulating film;

padding said first connection hole with a metallic film to form a first plug;

forming a second interlayer insulating film on said first interlayer insulating film;

removing selectively a predetermined portion of said second interlayer insulating film and forming a second connection hole the sides of which are substantially vertical to the bottom thereof, the second connection hole penetrating said second interlayer insulating film; and padding said second connection hole with a metallic film and forming a second plug directly connected with said first plug, wherein each of said first and second interlayer insulating films has an upper surface that is substantially flat over areas, at a principal plane of the substrate, where said memory cell array part and said peripheral circuit part are located, and a height of the upper surface of each of said first and second interlayer insulating films, measured as a vertical distance away from the principal plane of the substrate, is substantially equal at locations of said memory cell array part and said peripheral circuit part, and wherein over an area where said memory cell array part is located a plug formed thereat has a vertical length substantially the same as a thickness of an interlayer insulating film corresponding thereto, and over an area where said peripheral circuit part is located a plug formed thereat has a vertical length that is less than the thickness of an interlayer insulating film corresponding thereto.

2. A method for fabricating a semiconductor integrated circuit device according to claim 1, wherein the step of forming said first interlayer insulating film on said semiconductor substrate is preceded by a step of forming an insulated-gate field-effect type transistor in said semiconductor substrate, and said first connection hole is formed to allow the surface of a diffusion layer of said insulated-gate field-effect type transistor to be exposed.

3. A method for fabricating a semiconductor integrated circuit device according to claim 2, further comprising a step of flattening the top of said first interlayer insulating film and of said second interlayer insulating film.

4. A method for fabricating a semiconductor integrated circuit device according to claim 3, wherein the step of flattening the top of each of said first interlayer insulating film and said second interlayer insulating film is performed by a chemical mechanical polishing method.

5. A method for fabricating a semiconductor integrated circuit device according to claim 4, wherein said second interlayer insulating film is formed on a film on which a polishing rate by said chemical mechanism polishing method is smaller than that on the second interlayer insulating film.

6. A method for fabricating a semiconductor integrated circuit device according to claim 5, wherein said film on which the polishing rate by said chemical mechanism polishing method is smaller than that on said second interlayer insulating film is a silicon nitride film.

7. A method for fabricating a semiconductor integrated circuit device according to claim 1, wherein said second interlayer insulating film is formed on a film on which an etching rate by dry etching is smaller than that on said second interlayer insulating film, and the step of forming said second connection hole comprises the steps of:

removing selectively a predetermined portion of said second interlayer insulating film until the surface of the film on which said etching rate is smaller is exposed, and removing the exposed portion of the surface of the film on which said etching rate is smaller.

8. A method for fabricating a semiconductor integrated circuit device according to claim 7, wherein the film on which said etching rate is smaller is a silicon nitride film.

9. A method for fabricating a semiconductor integrated circuit device according to claim 7, wherein said film on which the polishing rate by said chemical mechanical polishing method is smaller and the film on which said etching rate is smaller are the same film.

10. A method for fabricating a semiconductor integrated circuit device according to claim 1, wherein the steps of padding said first and second connection holes with said metallic film are performed using a selective CVD method or a CVD method.

11. A method for fabricating a semiconductor integrated circuit device according to claim 10, wherein the steps of padding said first and second connection holes with said metallic films, respectively, are followed by the steps of polishing said metallic films to flatten the surfaces thereof, respectively.

12. A method for fabricating a semiconductor integrated circuit device according to claim 1, wherein each of said first and second interlayer insulating films is formed to have a film thickness of less than or equal to 1.0 µm and greater than or equal to 0.3 µm.

13. A method for fabricating a semiconductor integrated circuit device according to claim 1, further comprising a step of flattening the top of said first interlayer insulating film and of said second interlayer insulating film.

14. A method for fabricating a semiconductor integrated circuit device according to claim 13, wherein the step of flattening the top of each of said first interlayer insulating film and said second interlayer insulating film is performed by a chemical mechanical polishing method.

15. A method for fabricating a semiconductor integrated circuit device according to claim 14, wherein said second interlayer insulating film is formed on a film on which a polishing rate by said chemical mechanism polishing method is smaller than that on said second interlayer insulating film.

16. A method for fabricating a semiconductor integrated circuit device according to claim 15, wherein said film on which the polishing rate by said chemical mechanism polishing method is smaller than that on said second interlayer insulating film is a silicon nitride film.

17. A method for fabricating a semiconductor integrated circuit device according to claim 7, wherein the steps of padding said first and second connection holes with said metallic film are performed using a selective CVD method or a CVD method.

18. A method for fabricating a semiconductor integrated circuit device according to claim 7, wherein the steps of padding said first and second connection holes with said metallic films, respectively, are followed by the steps of polishing said metallic films to flatten the surfaces thereof, respectively.

19. A method for fabricating a semiconductor integrated circuit device according to claim 7, wherein each of said first and second interlayer insulating films is formed to have a film thickness of less than or equal to 1.0 μm and greater than or equal to 0.3 μm.

20. A method for fabricating a semiconductor integrated circuit device, which at least includes a memory cell array part and a peripheral circuit part, comprising the steps of:

forming a first interlayer insulating film on a semiconductor substrate;

removing selectively a predetermined portion of said first interlayer insulating film and forming at least one first connection hole the sides of each of which are substantially vertical to the bottom thereof, each of said at least one first connection hole penetrating said first interlayer insulating film;

padding each of said at least one first connection hole with a metallic film to form at least one first plug;

forming a second interlayer insulating film on said first interlayer insulating film;

removing selectively a predetermined portion of said second interlayer insulating film and forming at least one second connection hole the sides of each of which are substantially vertical to the bottom thereof, each of said at least one second connection hole penetrating said second interlayer insulating film; and padding each of said at least one second connection hole with a metallic film and forming at least one second plug each directly connected with a corresponding one of said at least one first plug, wherein each of said first and second interlayer insulating films has an upper surface that is substantially flat over areas, at a principal plane of the substrate, where said memory cell array part and said peripheral circuit part are located, and a height of the upper surface of each of said first and second interlayer insulating films, measured as a vertical distance away from the principal plane of the substrate, is substantially equal at locations of said memory cell array part and said peripheral circuit part, and wherein over an area where said memory cell array part is located each plug formed thereat has a vertical length substantially the same as a thickness of an interlayer insulating film corresponding thereto, and over an area where said peripheral circuit part is located a plug formed thereat has a vertical length that is less than the thickness of an interlayer insulating film corresponding thereto.

\* \* \* \* \*